United States Patent
Kim et al.

(10) Patent No.: US 11,177,418 B2
(45) Date of Patent: Nov. 16, 2021

(54) DISPLAY DEVICE AND METHOD FOR MANUFACTURING THE SAME

(71) Applicant: Samsung Display Co., Ltd., Yongin-Si (KR)

(72) Inventors: Doohwan Kim, Yongin-si (KR); Jaemyong Kim, Incheon (KR); Jaehyuk Lee, Seoul (KR); Joowon Lee, Hwaseong-si (KR); Yoonhyeung Cho, Yongin-si (KR)

(73) Assignee: Samsung Display Co., Ltd.

( * ) Notice: Subject to any disclaimer, the term of this patent is extended or adjusted under 35 U.S.C. 154(b) by 28 days.

(21) Appl. No.: 16/507,361

(22) Filed: Jul. 10, 2019

(65) Prior Publication Data
US 2020/0119237 A1    Apr. 16, 2020

(30) Foreign Application Priority Data
Oct. 12, 2018    (KR) .................. 10-2018-0121956

(51) Int. Cl.
| | |
|---|---|
| *H01L 33/50* | (2010.01) |
| *H01L 25/075* | (2006.01) |
| *H01L 33/48* | (2010.01) |
| *H01L 33/54* | (2010.01) |

(52) U.S. Cl.
CPC ........ *H01L 33/505* (2013.01); *H01L 25/0753* (2013.01); *H01L 33/483* (2013.01); *H01L 33/504* (2013.01); *H01L 33/54* (2013.01)

(58) Field of Classification Search
None
See application file for complete search history.

(56) References Cited

U.S. PATENT DOCUMENTS

| | | | |
|---|---|---|---|
| 8,921,840 B2 | 12/2014 | Kim et al. | |
| 10,185,066 B2 | 1/2019 | Chae et al. | |
| 10,483,335 B2 | 11/2019 | Bang et al. | |
| 10,593,909 B2* | 3/2020 | Shimoyama | ............ H01L 51/56 |
| 2010/0187553 A1* | 7/2010 | Chen | ...................... H01L 33/60 |
| | | | 257/98 |
| 2011/0042647 A1* | 2/2011 | Choi | ............... H01L 31/035236 |
| | | | 257/21 |

(Continued)

FOREIGN PATENT DOCUMENTS

| | | |
|---|---|---|
| EP | 3343662 A1 | 7/2018 |
| JP | 2018-092873 A | 6/2018 |

(Continued)

OTHER PUBLICATIONS

Extended European Search Report, Application No. 19196369.3 dated Mar. 18, 2020, 8 pages.

*Primary Examiner* — Long Pham
(74) *Attorney, Agent, or Firm* — Innovation Counsel LLP

(57) ABSTRACT

Provided is a display device. The display device includes a base layer, a plurality of wavelength conversion parts disposed on one surface of the base layer, a partition wall disposed between the adjacent wavelength conversion parts of the plurality of wavelength conversion parts and having a first refractive index, a cover part configured to cover the plurality of wavelength conversion parts and having a second refractive index greater than the first refractive index, and an image display part disposed on a surface provided by the partition wall and the cover part.

16 Claims, 20 Drawing Sheets

(56) References Cited

U.S. PATENT DOCUMENTS

| | | | |
|---|---|---|---|
| 2012/0218173 A1* | 8/2012 | Ohta | G02B 27/1046 |
| | | | 345/76 |
| 2015/0090991 A1* | 4/2015 | Ishii | H01L 27/3272 |
| | | | 257/40 |
| 2015/0130007 A1* | 5/2015 | Kawamura | H01L 27/14685 |
| | | | 257/432 |
| 2015/0144928 A1 | 5/2015 | Forrest et al. | |
| 2017/0170247 A1 | 6/2017 | Kim | |
| 2017/0179438 A1* | 6/2017 | Xu | H01L 27/322 |
| 2018/0159080 A1* | 6/2018 | Shimoyama | H01L 51/5253 |
| 2020/0119237 A1* | 4/2020 | Kim | H01L 51/5281 |

FOREIGN PATENT DOCUMENTS

| | | |
|---|---|---|
| KR | 10-2014-0059372 A | 5/2014 |
| KR | 10-2018-0018945 A | 2/2018 |
| KR | 10-2018-0026267 A | 3/2018 |

* cited by examiner

DISPLAY DEVICE AND METHOD FOR MANUFACTURING THE SAME

CROSS-REFERENCE TO RELATED APPLICATIONS

This U.S. non-provisional patent application claims priority under 35 U.S.C. § 119 to Korean Patent Application No. 10-2018-0121956, filed on Oct. 12, 2018, the entire contents of which are hereby incorporated by reference.

BACKGROUND

The present disclosure herein relates to a display device having improved display quality and light efficiency and a method for manufacturing the same.

A display device may include a wavelength conversion member to express a color. The wavelength conversion member may include pigment particles containing a predetermined color or a light emitting body emitting light having a predetermined color. When light provided from one pixel area is provided to an adjacent pixel areas, color mixing problem is occurred.

SUMMARY

Embodiments provide a display device having improved display quality and light efficiency and a method for manufacturing the same.

An embodiment of the inventive concept provides a display device including: a base layer; a plurality of wavelength conversion parts disposed on one surface of the base layer; a partition wall disposed between adjacent wavelength conversion parts of the plurality of wavelength conversion parts and having a first refractive index; a cover part configured to cover the plurality of wavelength conversion parts and having a second refractive index greater than the first refractive index; and an image display part disposed on a surface provided by the partition wall and the cover part.

In an embodiment, the surface is a flat surface, and the image display part may contact the flat surface provided by the partition wall and the cover part.

In an embodiment, the image display part may include: a base substrate; a circuit layer disposed on the base substrate; a light emitting element layer disposed on the circuit layer; and an encapsulation layer covering the light emitting element layer and the circuit layer, wherein the encapsulation layer may directly contact the partition wall and the cover part.

In an embodiment, the partition wall may have a rectangular shape on a cross-section.

In an embodiment, the partition wall may have a trapezoid shape on a cross-section.

In an embodiment, of the partition wall may have a curvature on a cross-section.

In an embodiment, the partition wall may have a width that gradually increases from the base layer side toward the image display part side.

In an embodiment, the partition wall may have a width that gradually decreases from the base layer side toward the image display part side.

In an embodiment, the display device may further include a light blocking layer disposed between the base layer and the partition wall.

In an embodiment, a first sum of a thickness of the light blocking layer and a thickness of the partition wall may be substantially the same as a distance between the base layer and the image display part, and the first sum may be substantially the same as a second sum of a thickness of one wavelength conversion part of the plurality of wavelength conversion parts and a thickness of the cover part disposed on the wavelength conversion part.

In an embodiment, the plurality of wavelength conversion parts may include first wavelength conversion parts and second wavelength conversion parts, and the first wavelength conversion parts may be arranged in a first direction, the second wavelength conversion parts may be arranged in the first direction, and the first wavelength conversion parts and the second wavelength conversion parts may be alternately arranged in a second direction crossing the first direction.

In an embodiment, the partition wall may be provided in plurality, each of the plurality of partition walls may extend in the first direction, and the plurality of partition walls may be disposed to be spaced apart from each other in the second direction.

In an embodiment, the partition wall may be provided in plurality, and the plurality of partition walls may be arranged in the first direction and the second direction.

In an embodiment, a difference between the first refractive index and the second refractive index may be 0.5 or more.

In an embodiment, the partition wall may include one of polytetrafluoroethylene, magnesium fluoride, and polyvinylidene fluoride.

In an embodiment of the inventive concept, a display device includes: a base layer; a light blocking layer which is disposed on the base layer and in which a plurality of openings are defined; wavelength conversion parts one-to-one corresponding to the plurality of openings to cover the plurality of openings; a partition wall disposed between the wavelength conversion parts, disposed on the light blocking layer, and having a first refractive index; and a cover part configured to cover the wavelength conversion parts and having a second refractive index greater than the first refractive index, wherein the partition wall includes at least one of poly(tetrafluoroethylene), magnesium fluoride, or polyvinylidene fluoride.

In an embodiment of the inventive concept, a method for manufacturing a display device includes: preparing a base layer; forming a plurality of wavelength conversion parts on one surface of the base layer; forming an image display part; forming partition walls on the base layer or the image display part; forming a cover material between the partition walls; and bonding the image display part to the base layer with the partition walls and the cover material disposed therebetween, wherein the image display part and the base layer are bonded to each other so that the partition walls overlap areas adjacent to the plurality of wavelength conversion parts when viewed in a plane view.

In an embodiment, the partition walls may be formed on the base layer, wherein the partition walls may be formed after the plurality of wavelength conversion parts are formed.

In an embodiment, the partition walls may be formed on the base layer, wherein the plurality of wavelength conversion parts may be formed after the partition walls are formed.

In an embodiment, the forming of the partition walls may include a photo lithography process or a printing process.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
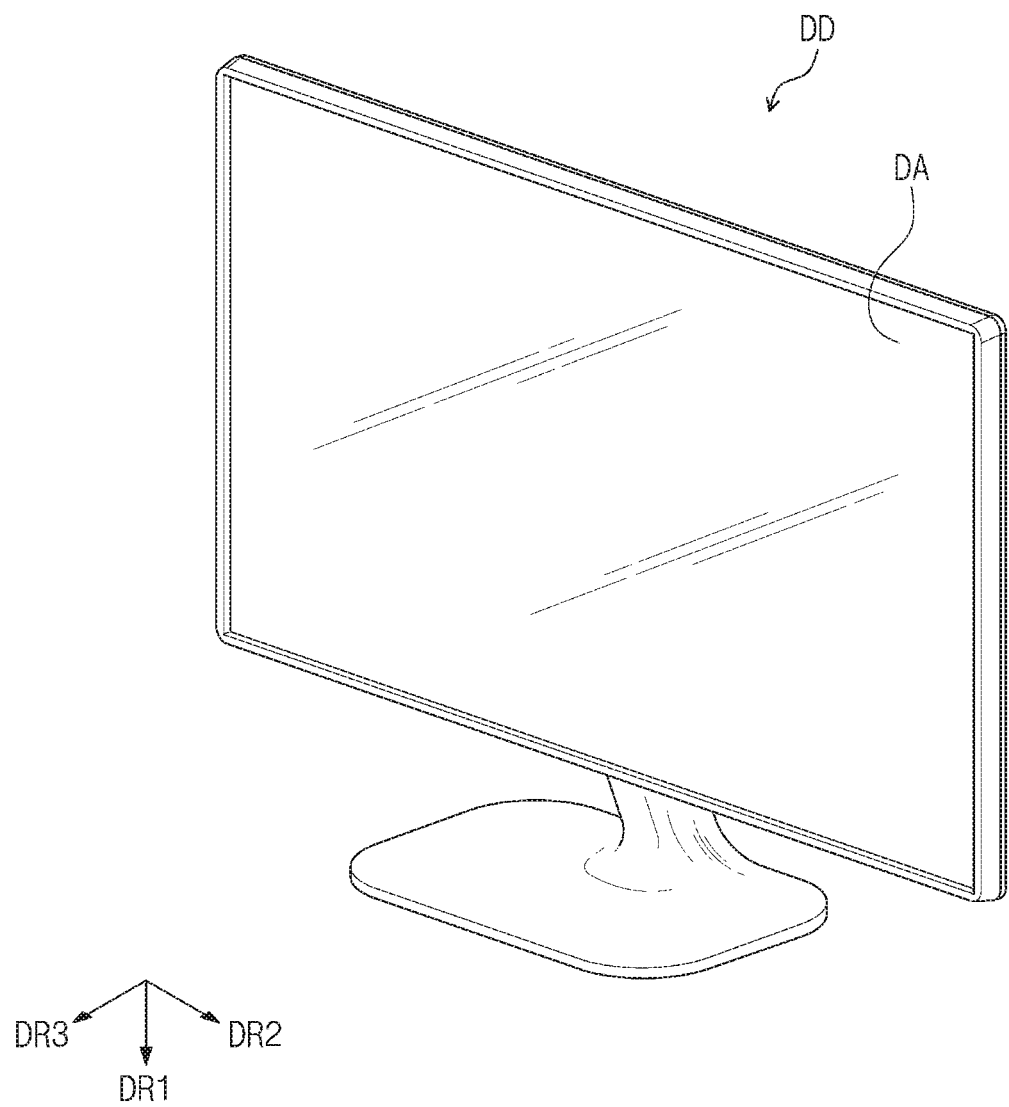
FIG. 1 is a perspective view of a display device according to an embodiment of the inventive concept.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this inventive concept belongs. Also, terms such as defined terms in commonly used dictionaries are to be interpreted as having meanings consistent with meaning in the context of the relevant art and are expressly defined herein unless interpreted in an ideal or overly formal sense.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, exemplary embodiments of the inventive concept will be described with reference to the accompanying drawings.

FIG. 1 is a perspective view of a display device according to an embodiment of the inventive concept;

Referring to FIG. 1, the display device DD may display an image through a display area DA. FIG. 1 illustrates an example in which the display area DA is provided on a flat surface defined by a first direction DR1 and a second direction DR2 crossing the first direction DR1. However, a display area of a display device according to another embodiment of the inventive concept may be provided on a curved surface.

A thickness of the display device DD is indicated in a third direction DR3. The directions indicated as the first to third direction DR1, DR2, and DR3 may be a relative concept and thus changed into different directions. In this specification, "when viewed in a plane view" may mean a view in the third direction DR3. Also, the "thickness direction" may mean the third direction DR3.

FIG. 1 illustrates an example in which the display device DD is a television. However, the display device DD may be large electronic devices such as a monitor, or an external billboard as well as small and middle electronic devices such as a personal computer, a notebook computer, a personal digital terminal, a car navigation, a game console, a smart phone, a tablet, and a camera. Also, the above-described devices are exemplified as merely an exemplary embodiment, and thus, the display device DD may be adopted for other electronic equipment unless departing from the spirit and scope of the inventive concept.

Figure 2:
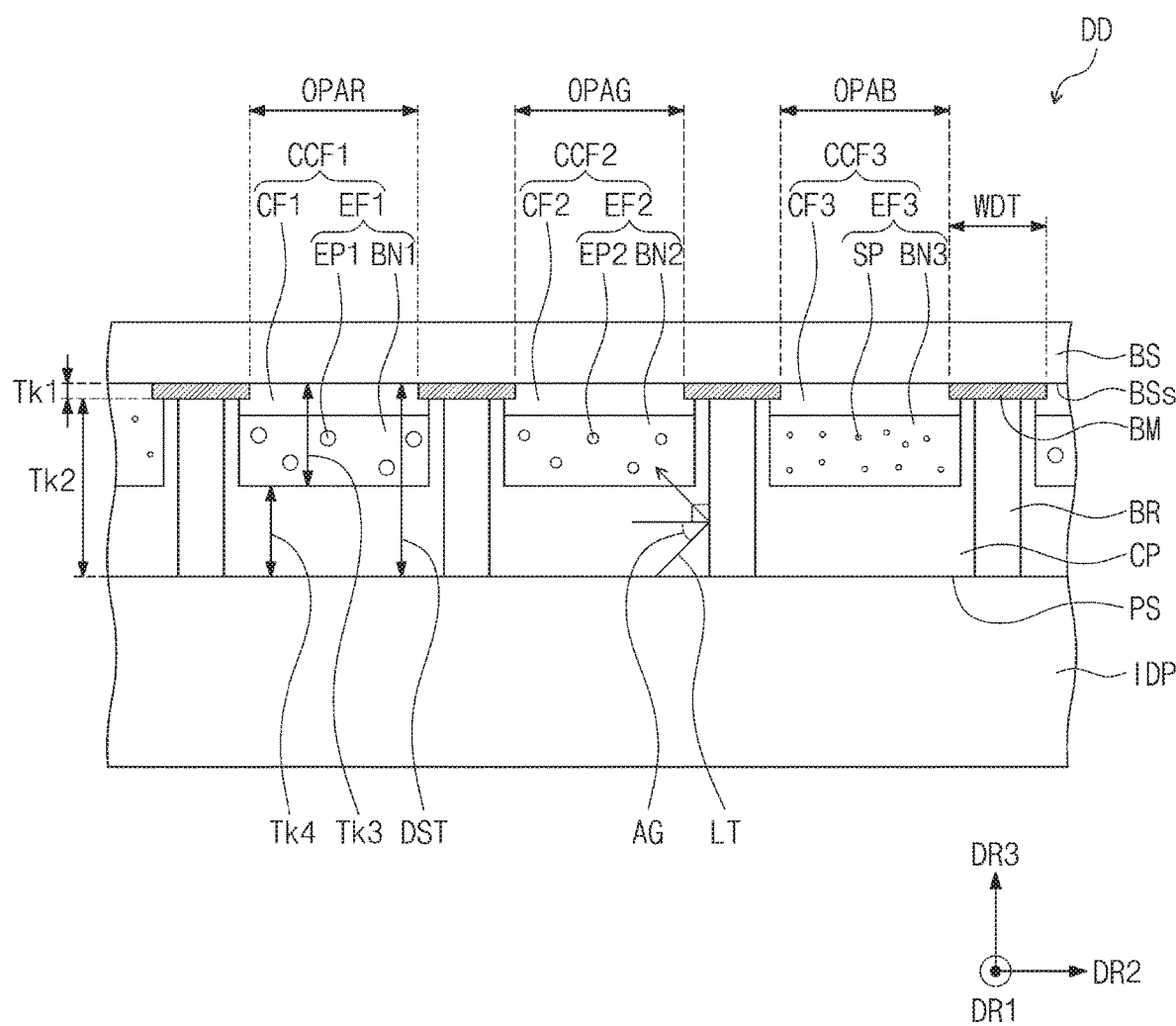
FIG. 2 is a cross-sectional view of the display device according to an embodiment of the inventive concept.

FIG. 2 is a cross-sectional view of the display device according to an embodiment of the inventive concept.

Referring to FIG. 2, the display device DD may include a base layer BS, wavelength conversion parts CCF1, CCF2, and CCF3, a light blocking layer BM, a partition wall BR, a cover part CP, and an image display part IDP.

The base layer BS may be a plastic substrate, a glass substrate, an insulation film, or a laminate structure including a plurality of insulation layers.

The light blocking layer BM may be disposed on one surface BSs of the base layer BS. The light blocking layer BM may include a light blocking material. For example, the light blocking material may be a black pigment and a black dye. A plurality of openings OPAR, OPAG, and OPAB may be defined in the light blocking layer BM. The plurality of openings OPAR, OPAG, and OPAB may be areas through which light is transmitted and may one-to-one correspond to the pixel areas.

The plurality of openings OPAR, OPAG, and OPAB may include a first opening OPAR, a second opening OPAG, and a third opening OPAB. Light passing through the first opening OPAR, the second opening OPAG, and the third opening OPAB may have wavelengths different from each other.

The wavelength conversion parts CCF1, CCF2, and CCF3 may be disposed on the one surface BSs of the base layer BS. The wavelength conversion parts CCF1, CCF2, and CCF3 may include a first wavelength conversion part CCF1, a second wavelength conversion part CCF2, and a third wavelength conversion part CCF3.

The first wavelength conversion part CCF1 may cover the first opening OPAR, the second wavelength conversion part CCF2 may cover the second opening OPAG, and the third wavelength conversion part CCF3 may cover the third opening OPAB. Each of the first wavelength conversion part CCF1, the second wavelength conversion part CCF2 and the third wavelength conversion part CCF3 may completely cover the plurality of openings OPAR, OPAG, and OPAB in the light blocking layer BM and opposing edges of the light blocking layer BM.

The wavelength conversion part CCF1 may include a first color filter layer CF1 and a first wavelength conversion layer EF1, and the second wavelength conversion part CCF2 may include a second color filter layer CF2 and a second wavelength conversion layer EF2. The first wavelength conversion layer EF1 may include a first base BN1 and a first light emitting body EP1, and the second wavelength conversion layer EF2 may include a second base BN2 and a second light emitting body EP2.

The third wavelength conversion part CCF3 may include a third color filter layer CF3 and a light transmission layer EF3, and the light transmission layer EF3 may include a third base BN3 and scattering particles SP. For example, the scattering particles SP may be $TiO_2$ or silica-based nano particles. The third wavelength conversion part CCF3 may scatter blue light to provide the scattered blue light to the third color filter layer CF3. However, the embodiment of the inventive concept is not limited thereto. For example, according to another embodiment of the inventive concept, the third wavelength conversion part CCF3 may not include a blue color filter, and the light transmission layer EF3 may further include a third light emitting body.

Although not shown, a protection layer may be further disposed between the first color filter layer CF1 and the first wavelength conversion layer EF1, between the second color filter layer CF2 and the second wavelength conversion layer EF2, and between the third color filter layer CF3 and the light transmission layer EF3. The protection layer may cover the first color filter layer CF1, the second color filter layer CF2, and the third color filter layer CF3. The protection layer may include a transparent insulating layer such as silicon oxide, silicon nitride, and silicon oxynitride.

Each of the first to third bases BN1, BN2, and BN3 may be a transparent polymer resin. For example, each of the first to third bases BN1, BN2, and BN3 may be an acrylic-based resin, a urethane-based resin, a silicone-based resin, an epoxy-based resin, or the like.

Each of the first light emitting body EP1 and the second light emitting body EP2 may include a material that absorbs predetermined light and convert a wavelength of the absorbed light to a light having different wavelength than that of the predetermined light. For example, each of the first light emitting body EP1 and the second light emitting body EP2 may be a quantum dot. The first light emitting body EP1 may absorb light to emit first color light, for example, red light. The second light emitting body EP2 may absorb light to emit second color light, for example, green light.

The quantum dot may be selected from Group II-VI compounds, Group III-V compounds, Group IV-VI compounds, Group IV elements, Group IV compounds, and a combination thereof.

The Group II-VI compounds may be selected from binary element compounds selected from the group consisting of CdSe, CdTe, ZnS, ZnSe, ZnTe, ZnO, HgS, HgSe, HgTe, MgSe, MgS, and a combination thereof, ternary element compounds selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and quaternary element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compounds may be selected from binary element compounds selected from the group consisting of GaN, GaP, GaAs, GaSb, AN, AlP, AlAs, AlSb, InN, InP, InAs, InSb, and a combination thereof, ternary element compounds selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a combination thereof, and quaternary element compounds selected form the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group IV-VI compounds may be selected from binary element compounds selected from the group consisting of SnS, SnSe, SnTe, PbS, PbSe, PbTe, and a combination thereof, ternary element compounds selected from the group consisting of SnSeS, SnSeTe, SnSTe, PbSeS, PbSeTe, PbSTe, SnPbS, SnPbSe, SnPbTe, and a combination thereof, and quaternary element compounds selected form the group consisting of SnPbSSe, SnPbSeTe, SnPbSTe, and a combination thereof.

The Group IV elements may be selected from the group consisting of Si, Ge, and a combination thereof. The Group IV compounds may be binary element compounds selected from the group consisting of SiC, SiGe, and a combination thereof. Here, the binary element compounds, the ternary element compounds, and the quaternary element compounds may exist in the particle at a uniform concentration or exist in the particle in a state in which concentration distribution is partitioned into partially different states.

The quantum dot may have a core shell structure including a shell surrounding a core. Alternatively, the quantum dot may have a core/shell structure in which one quantum dot surrounds the other quantum dot. An interface between the core and the shell may have a concentration gradient in which an element existing in the shell has a concentration that gradually decreases toward a center.

The quantum dot may have a particle having a size of a nano scale. Also, the quantum dot may have a shape such as a spherical shape, a pyramidal shape, a multi-arm shape, or a shape of cubic nanoparticles, nanotubes, nanowires, nano-fibers, nano-plate-like particles, and the like. However, the embodiment of the inventive concept is not limited thereto.

Light emitted through the quantum dot may be emitted in all directions (360 degrees) to improve an optical viewing angle.

The light emitted from the quantum dot may vary in color according to a particle size of the quantum dot. Thus, the first light emitting body EP1 may have a particle size different from that of the second light emitting body EP2. For example, the first light emitting body EP1 may have a particle size greater than that of the second light emitting body EP2. In this case, the first light emitting body EP1 may emit light having a wavelength greater than that emitted from the second light emitting body EP2.

The first color filter layer CF1 may absorb light which is not converted by the first light emitting body EP1 among light passing through the first wavelength conversion layer EP1, and the second color filter layer CF2 may absorb light which is not converted by the second light emitting body EP2 among light passing through the second wavelength conversion layer EP2. Also, the first to third color filter layers CF1, CF2, and CF3 may prevent external light from being incident onto the first wavelength conversion layer EF1, the second wavelength conversion layer EF2, and the light transmission layer EF3. The first color filter layer CF1 may be a red color filter layer, the second color filter layer CF2 may be a green color filter layer, and the third color filter layer CF3 may be a blue color filter layer. According to another embodiment of the inventive concept, each of the first color filter layer CF1 and the second color filter layer CF2 may be a yellow color filter. According to another embodiment of the inventive concept, at least one of the first to third color filters CF1, CF2, and CF3 may be omitted.

The partition wall BR may be disposed between the adjacent wavelength conversion parts of the first to third wavelength conversion parts CCF1, CCF2, and CCF3 to overlap the light blocking layer BM. For example, the partition wall BR may be disposed between the first wavelength conversion part CCF1 and the second wavelength conversion part CCF2, between the second wavelength conversion part CCF2 and the third wavelength conversion part CCF3, and between the third wavelength conversion part CCF3 and the first wavelength conversion part CCF1. The partition wall may have a square shape on a cross-section. For example, the partition wall BR may have a rectangular shape. The cross-section may be a plane parallel to the second direction DR2 and the third direction DR3.

The first to third wavelength conversion parts CCF1, CCF2, and CCF3 may be covered by the cover part CP. The cover part CP may fill a space between adjacent partition walls BR in the first to third wavelength conversion parts CCF1, CCF2, and CCF3.

The partition wall BR may has a first refractive index, and the second cover part CP may have a second refractive index. The first refractive index may be less than the second refractive index.

The light incident onto the partition wall BR may be changed in critical angle due to the difference in refractive index. The light incident at the critical angle or more may be totally reflected by a boundary between the cover part CP and the partition wall BR. When a difference between the first refractive index and the second refractive index is about 0.7, the critical angle may be about 36 degrees, and when a difference between the first refractive index and the second refractive index is about 0.6, the critical angle may be about 40.3 degrees. When a difference between the first refractive index and the second refractive index is about 0.5, the critical angle may be about 44.9 degrees, and when a difference between the first refractive index and the second refractive index is about 0.4, the critical angle may be about 49.9 degrees. When a difference between the first refractive index and the second refractive index is about 0.3, the critical angle may be about 55.4 degrees, when a difference between the first refractive index and the second refractive index is about 0.2, the critical angle may be about 61.9 degrees, and when a difference between the first refractive index and the second refractive index is about 0.1, the critical angle may be about 70.3 degrees. The measured critical angles may be critical angles measured according to the variation in refractive index of the partition wall BR when the cover part CP has a refractive index of about 1.7.

The difference between the first refractive index and the second refractive index may be equal to or greater than about 0.1 and may be equal to or less than about 2.0. For example, the difference in refractive index may be equal to or greater than about 0.1 and may be equal to or less than about 0.7, particularly, the difference in refractive index may be from about 0.5 to about 0.7.

A portion LT of light incident onto an area overlapping the second opening OPAG may travel to the partition wall BR. In the case in which the difference between the first refractive index and the second refractive index is about 0.5, when an incident angle AG, which is an angle formed between a line perpendicular to the surface of the partition wall BR and the portion LT of light incident onto the surface of the partition wall BR, of the light LT is about 44.9 degrees or more, the light LT may be totally reflected and then incident into the second wavelength conversion part CCF2. Thus, the color mixing phenomenon in which the colors are mixed between the adjacent pixels may be prevented by the partition wall having lower refractive index than that of the cover part CP. As a result, the display quality may be improved. In addition, because the color mixing phenomenon in which the colors are mixed between the adjacent pixels is prevented by the partition wall, a width WDT of the light blocking layer BM may decrease and thus an aperture ratio of the display device DD may be increased. Also, the light totally reflected by the partition wall BR may be incident again onto the corresponding wavelength conversion part, thereby improving light efficiency by preventing the light from being lost.

The partition wall BR may be made of a material having a refractive index greater than about 1.0 and equal to or less than about 1.6. For example, the partition wall BR may include at least one of polytetrafluoroethylene, magnesium fluoride, or polyvinylidene fluoride. In addition to the above-described materials, the partition wall BR may include at least one of polyethylene terephthalate (PET), polycarbonate, poly(methyl methacrylate) (PMMA), silicone oil, ethylene tetrafluoroethylene, polydimethylsiloxane, or polylactic acid.

A material which can be used for the cover part CP is not specifically limited as long as the material of the cover part CP has a refractive index greater than that of the partition wall BR. The cover part CP may be made of a resin, for example, a silicon-based polymer, an epoxy-based resin, or an acrylic-based resin. Also, when the partition wall BR includes polytetrafluoroethylene, the cover part CP may include polycarbonate or polyethylene terephthalate having a refractive index greater than that of polytetrafluoroethylene among the materials exemplified as the material of the partition wall BR.

The partition wall BR and the cover part CP may provide a flat surface PS. An image display part IDP may be disposed on the flat surface PS provided by the partition wall BR and the cover part CP. The flat surface PS and the image display part IDP may directly contact each other. For example, the image display part IDP may contact each of the partition wall BR and the cover part CP.

The image display part IDP may include a plurality of pixels (not shown). Each of the plurality of pixels (not shown) may include a pixel circuit and a light emitting element and may one-to-one correspond to the plurality of openings OPAR, OPAG, and OPAB.

The partition wall BR may be disposed between the image display part IDP and the light blocking layer BM disposed on the base layer BS to serve as a spacer. When a distance between the image display part IDP and the base layer BS is not uniform, a distance between the wavelength conversion parts CCF1, CCF2, and CCF3 and the image display part IDP may not be uniform, thereby luminance varies according to a position within the display device DD, or a color coordinate is changed according to a position within the display device DD. According to an embodiment of the inventive concept, the distance between the image display part IDP and the base layer BS may be uniformly maintained by the partition wall BR. Thus, the luminance variation according to the position within the display device DD (see FIG. 1), or the color coordinate change may be prevented from occurring.

According to an embodiment of the inventive concept, the first sum of a thickness Tk1 of the light blocking layer BM and a thickness Tk2 of the partition wall BR may be substantially the same as a distance DST between the base layer BS and the image display part IDP. Also, the first sum may be substantially the same as, for example, the second sum of a thickness Tk3 of the first wavelength conversion part CCF1 and a thickness Tk4 of the cover part CP on the first wavelength conversion part CCF1 among the wavelength conversion parts CCF1, CCF2, and CCF3. Here, the thickness Tk4 of the cover part CP may be a thickness of an area overlapping the first wavelength conversion part CCF1 in a cross-sectional view.

Figure 3A:
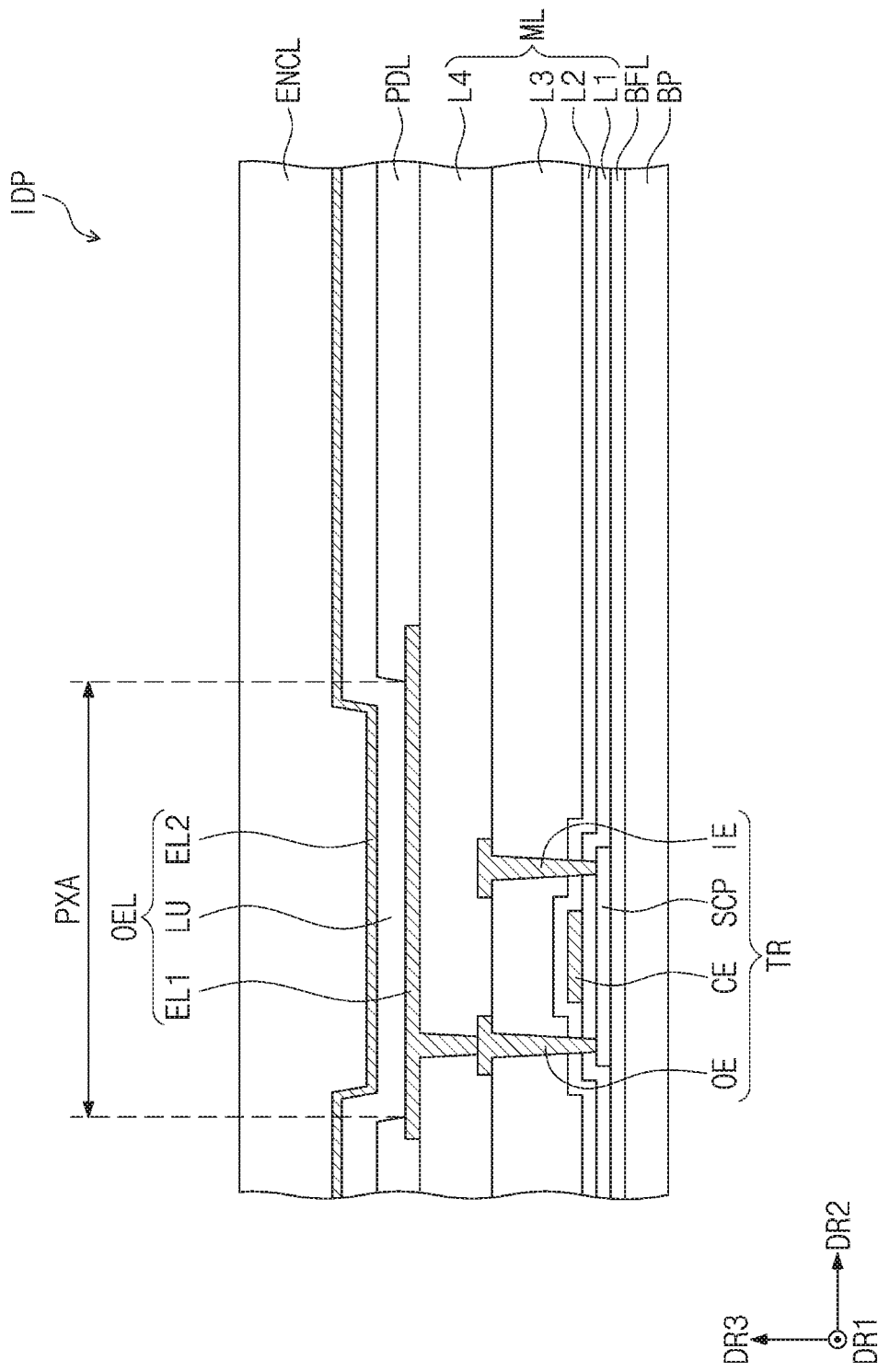
FIG. 3A is a cross-sectional view of an image display part according to an embodiment of the inventive concept.

FIG. 3A is a cross-sectional view of the image display part according to an embodiment of the inventive concept.

Referring to FIG. 3A, the image display part IDP may be an organic light emitting display panel. The image display part IDP may include a base substrate BP, a circuit layer ML, a light emitting element layer OEL, and an encapsulation layer ENCL.

The base substrate BP may be a plastic substrate, a glass substrate, an insulation film, or a laminate structure including a plurality of insulation layers.

A buffer layer BFL may be disposed on the base substrate BS. The circuit layer ML may be disposed on the buffer layer BFL. The circuit layer ML may include a transistor TR and insulation layers L1, L2, L3, and L4.

The transistor TR may be disposed on the buffer layer BFL. The transistor TR may include a control electrode CE, an input electrode IE, an output electrode OE, and a semiconductor pattern SCP.

The semiconductor pattern SCP may be disposed on the buffer layer BFL. The buffer layer BFL may provide a modified surface on the semiconductor pattern SCP. In this case, the semiconductor pattern SCP may have the adhesion force with the buffer layer BFL greater than the adhesion force with the base substrate BP. Alternatively, the buffer layer BFL may be a barrier layer that protects a bottom surface of the semiconductor pattern SCP. In this case, the buffer layer BFL may prevent contaminants or moisture to be introduced into the circuit layer ML and the light emitting element layer OEL from outside through the base substrate BP or from the base substrate BP into the circuit layer ML and the light emitting element layer OEL from being permeated into the semiconductor pattern SCP.

The first insulation layer L1 may be disposed on the buffer layer BFL to cover the semiconductor pattern SCP. The first insulation layer L1 may include an inorganic material. For example, the inorganic material may be silicon nitride, silicon oxynitride, silicon oxide, titanium oxide, or aluminum oxide, but is not limited thereto.

The control electrode CE may be disposed on the first insulation layer L1. The second insulation layer L2 may be disposed on the first insulation layer L1 to cover the control electrode CE. The second insulation layer L2 may include an inorganic material.

The third insulation layer L3 may be disposed on the second Insulation layer L2. The input electrode IE and the output electrode OE may be disposed on the third insulation layer L3. The input electrode IE and the output electrode OE may be connected to the semiconductor pattern SCP through through-holes passing through the first to third insulation layers L1, L2, and L3.

The fourth insulation layer L4 may be disposed on the third insulation layer L3 to cover the input electrode IE and the output electrode OE. The fourth insulation layer L4 may be a single layer or a plurality of layers. The fourth insulation layer L4 may include an organic material and/or an inorganic material.

The light emitting element layer OEL (hereinafter, referred to as an organic light emitting element) may be disposed on the fourth insulation layer L4. The organic light emitting element OEL may include a first electrode layer EL1, a light emitting layer LU, and a second electrode layer EL2.

The first electrode layer EL1 may be disposed on the fourth insulation layer L4 and electrically connected to the output electrode OE through the through-hole passing through the fourth insulation layer L4. The first electrode layer EL1 may be a pixel electrode layer or an anode electrode layer. The first electrode layer EL1 may be made of a material having a high work function so that holes are easily injected.

A pixel defining layer PDL is disposed on the fourth insulation layer L4 and the first electrode layer ELL The pixel defining layer PDL exposes a portion of the first electrode layer ELL The exposed area of the first electrode layer EL1 may be defined as a pixel area PXA. The pixel area PXA may correspond to one of the plurality of openings OPAR, OPAG, and OPAB, which are described with reference to FIG. 2.

The image display layer IDP may include a plurality of pixels (not shown). Each of the plurality of pixels may include a pixel circuit and a pixel electrode. The pixel circuit may include a plurality of transistors TR and at least one capacitor. One of the plurality of transistors TR is illustrated in FIG. 3A. The pixel electrode may be a first electrode layer ELL The second electrode layer EL2 is disposed on the first electrode layer ELL The second electrode layer EL2 may be a common electrode layer or a cathode electrode layer. The second electrode layer EL2 faces the first electrode layer ELL For example, when the first electrode layer EL1 is an anode electrode layer, the second electrode layer EL2 may be a cathode electrode layer. The second electrode layer EL2 may be made of a material having a low work function so that electrons are easily injected.

The light emitting layer LU may be disposed between the first electrode layer EL1 and the second electrode layer EL2 to generate blue light. For example, the light emitting layer LU may provide the blue light to the plurality of openings OPAR, OPAG, and OPAB (see FIG. 2).

The first wavelength conversion layer EF1 may convert the blue light into red light to provide the red light to the first color filter layer CF1, and the second wavelength conversion layer EF2 may convert the blue light into green light to provide the green light to the second color filter layer CF2. The light transmission layer EF3 may scatter the blue light to provide the scattered blue light to the third color filter layer CF3.

The first color filter layer CF1 may transmit light having a wavelength band of the red light and absorb light except for the light having the wavelength band of the red light. The second color filter layer CF2 may transmit light having a wavelength band of the green light and absorb light except for the light having the wavelength band of the green light. The third color filter layer CF3 may transmit light having a wavelength band of the blue light and absorb light except for the light having the wavelength band of the blue light. The light emitting layer LU may have a tandem structure or a single layer structure.

According to another embodiment of the inventive concept, the light emitting layer LU may generate light having a white color, light having a red color, or light having a green color. However, the embodiment of the inventive concept is not limited thereto.

The encapsulation layer ENCL may be disposed on the organic light emitting element OEL to cover the organic light emitting element OEL and the circuit layer ML. The encapsulation layer ENCL may seal the organic light emitting element OEL. For example, the encapsulation layer ENCL may protect the organic light emitting element OEL against foreign substances such as moisture/oxygen or dust particles. The encapsulation layer ENCL may be a laminated structure or a substrate. For example, the laminated structure may include at least one organic encapsulation layer and at least one inorganic encapsulation layer, which are alternately laminated. The substrate may be a glass substrate or a plastic substrate.

Figure 3B:
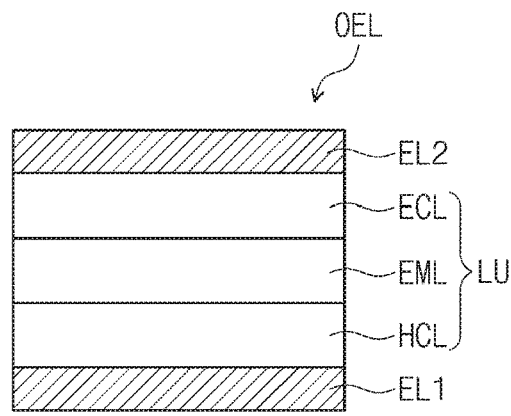
FIG. 3B is a cross-sectional view of an organic light emitting element according to an embodiment of the inventive concept.

FIG. 3B is a cross-sectional view of an organic light emitting element according to an embodiment of the inventive concept.

Referring to FIG. 3B, an organic light emitting element OEL may include a first electrode layer EL1, a light emitting layer LU, and a second electrode layer EL2. The light emitting layer LU may include a hole control layer HCL, a light emitting layer EML, and an electron control layer ECL. The hole control layer HCL may be disposed between the light emitting layer EML and the first electrode layer EL1, and the electron control layer ECL may be disposed between the light emitting layer EML and the second electrode layer EL2.

The hole control layer HCL may include a hole injection layer, a hole transporting layer, a buffer layer, and an electron blocking layer. The hole control layer HCL may have a single layer made of a single material, a single layer made of materials different from each other, or a multi-layered structure including a plurality of layers made of materials different from each other. The hole control layer HCL may be made of at least one of the hole injection material or the hole transport material. Each of the hole injection material and the hole transporting material may be a well-known material.

The electron control layer ECL may include an electron injection layer, an electron transporting layer, and a hole blocking layer. The electron control layer ECL may have a single layer structure made of a single material, a single layer structure made of materials different from each other, or a multi-layered structure including a plurality of layers made of materials different from each other. The electron control layer ECL may include at least one of an electron transport material or an electron injection material. Each of the electron injection material and the electron transporting material may be a well-known material.

The light emitting layer EML may include a host material and a dopant material. The light emitting layer EML may be formed by using a phosphorescent or fluorescent light emitting material as a dopant in the host material. The light emitting layer EML may emit light having a predetermined color. For example, the light emitting layer EML may emit blue light.

Figure 3C:
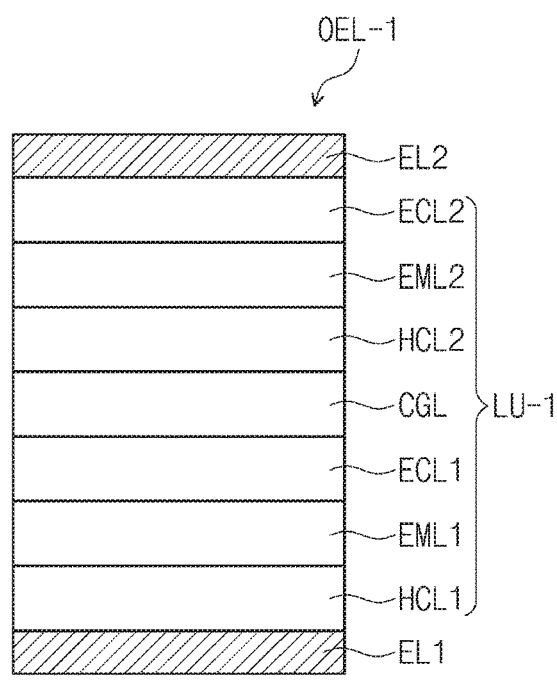
FIG. 3C is a cross-sectional view of an organic light emitting element according to an embodiment of the inventive concept.

FIG. 3C is a cross-sectional view of an organic light emitting element according to an embodiment of the inventive concept.

Referring to FIG. 3C, an organic light emitting element OEL-1 may include a first electrode layer EL1, a light emitting layer LU-1, and a second electrode layer EL2. The light emitting layer LU-1 may include a first hole control layer HCL1, a first light emitting layer EML1, a first electron control layer ECL1, a charge generation layer CGL, a second hole control layer HCL2, a second light emitting layer EML2, and a second electron control layer ECL2.

The charge generation layer CGL may be disposed between the first and second light emitting layers EML1 and EML2. When a voltage is applied to the charge generation layer CGL, a complex may be generated by oxidation-reduction reaction to generate charges.

The electrons generated in the charge generation layer CGL may reach the first light emitting layer EML1 via the first electron control layer ECL1. The holes generated in the charge generation layer CGL may reach the second light emitting layer EML2 via the second hole control layer HCL2.

In this embodiment, each of the first light emitting layer EML1 and the second light emitting layer EML2 may generate light having a wavelength band of the blue light. The first light emitting layer EML1 and the second light emitting layer EML2 may include the same material or materials different from each other.

The first light emitting layer EML1 generates first light. The second light emitting layer EML2 generates second light. Each of the first light and the second light may be light having a wavelength band of the blue light. The first light and second light may have the same spectrum or spectrums different from each other. For example, the first light may be one of deep blue light, light blue light, and blue light, and the second light may be one of deep blue light, light blue light, and blue light.

However, the above-described description may be merely an example. The first and second light emitting layers EML1 and EML2 according to an embodiment of the inventive concept may be designed to generate light having various colors and also may not be limited to any one embodiment.

Figure 3D:
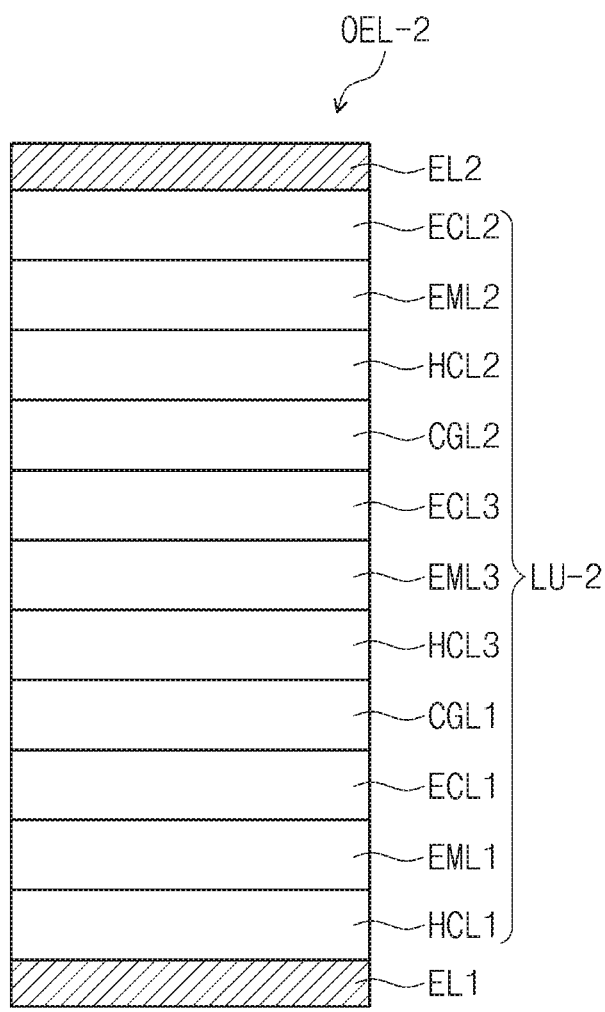
FIG. 3D is a cross-sectional view of an organic light emitting element according to an embodiment of the inventive concept.

FIG. 3D is a cross-sectional view of an organic light emitting element according to an embodiment of the inventive concept.

Referring to FIG. 3D, an organic light emitting element OEL-2 may include a first electrode layer EL1, a light emitting layer LU-2, and a second electrode layer EL2. The light emitting layer LU-2 may include a first hole control layer HCL1, a first light emitting layer EML1, a first electron control layer ECL1, a first charge generation layer CGL1, a second hole control layer HCL2, a second light emitting layer EML2, a second electron control layer ECL2, a second charge generation layer CGL2, a third hole control layer HCL3, a third light emitting layer EML3, and a third electron control layer ECL3.

The third light emitting layer EML3 may be disposed between the first light emitting layer EML1 and the second light emitting layer EML2. The first light emitting layer EML1 and the second light emitting layer EML2 may correspond to the first and second light emitting layers of FIG. 3C, respectively. The third light emitting layer EML3 may include a material different from that of each of the first light emitting layer EML1 and the second light emitting layer EML2. According to an embodiment of the inventive concept, the third light emitting layer EML3 may include the same material as at least one of the first light emitting layer EML1 and the second light emitting layer EML2.

Third light generated in the third light emitting layer EML3 may be light having a wavelength band of the blue light. For example, the third light may be one of deep blue light, light blue light, and blue light.

However, the above-described description may be merely an example. The third light emitting layer EML3 may be designed to generate light having various colors, but is not limited to a specific embodiment.

The first charge generation layer CGL1 is disposed between the first light emitting layer EML1 and the third light emitting layer EML3. Electrons generated in the first charge generation layer CGL1 may reach the first light emitting layer EML1 via the first electron control layer ECL1, and holes generated in the first charge generation layer CGL1 may reach the third light emitting layer EML3 via the third hole control layer HCL3.

The second charge generation layer CGL2 is disposed between the second light emitting layer EML2 and the third light emitting layer EML3. Holes generated in the second charge generation layer CGL2 may reach the second light emitting layer EML2 via the second hole control layer HCL1, and electrons generated in the second charge generation layer CGL2 may reach the third light emitting layer EML3 via the third electron control layer ECL3. Hereinafter, detailed description may correspond to those with respect to the above-described layers of FIG. 3, and thus, their detailed description will be omitted.

Figure 4:
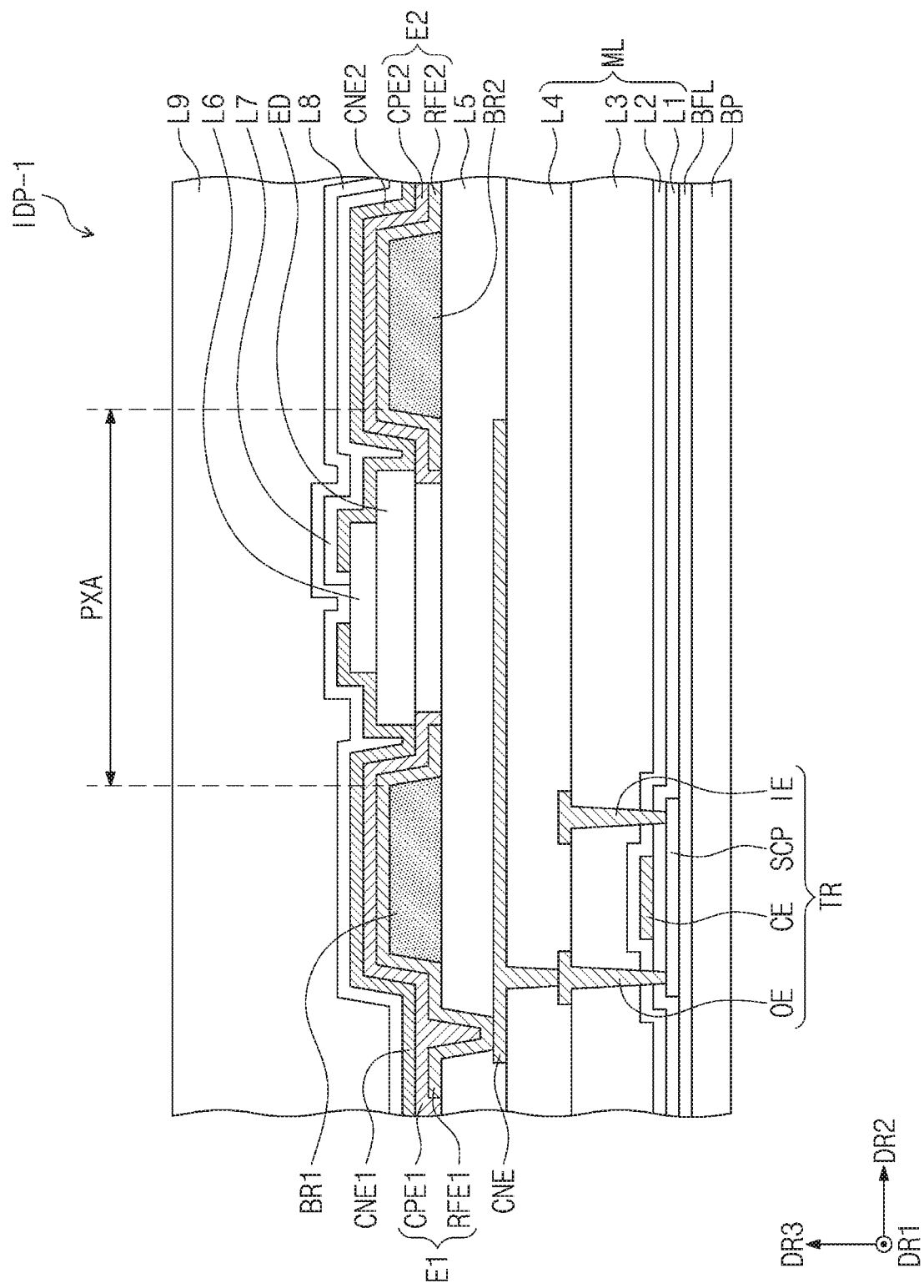
FIG. 4 is a cross-sectional view of an image display part according to an embodiment of the inventive concept.

FIG. 4 is a cross-sectional view of an image display part according to an embodiment of the inventive concept.

Referring to FIG. 4, an image display part IDP-1 may be a micro LED display panel. The image display part IDP-1 may include a base substrate BP, a circuit layer ML, and a light emitting element ED. The same reference numerals are used for the same constituents as those of FIG. 3A, and a description thereof will be omitted.

A connection electrode CNE may be disposed on a fourth insulation layer L4. The connection electrode CNE may be connected to an output electrode OE.

A fifth insulation layer L5 may be disposed on the fourth insulation layer L4 to cover the connection electrode CNE. The fifth insulation layer L5 may include an organic material. The fifth insulation layer L5 may cover a circuit layer ML disposed therebelow and provide a flat surface.

A first partition wall BR1 and a second partition wall BR2 are disposed on the fifth insulation layer L5. Each of the first partition wall BR1 and the second partition wall BR2 may extend in the first direction DR1. The second partition wall BR2 may be spaced apart from the first partition wall BR1 in the second direction DR2.

A first electrode E1 may be disposed on the first partition wall BR1, and a second electrode E2 may be disposed on the second partition wall BR2. The first electrode E1 may extend in the first direction DR1 to cover the first partition wall BR1, and the second electrode E2 may extend in the first direction DR1 to cover the second partition wall BR2. That is, the first partition wall BR1 may be disposed between the first electrode E1 and the fifth insulation layer L5, and the second partition wall BR2 may be disposed between the second electrode E2 and the fifth insulation layer L5.

A through-hole may be defined in the fifth insulation layer L5, and the connection electrode CNE may be exposed through the through-hole. The first electrode E1 may be electrically connected to the exposed connection electrode CNE via the through-hole. The second electrode E2 may be electrically connected to a power line, and a power voltage may be applied to the second electrode E2.

The first electrode E1 may include a first reflection electrode RFE1 and a first capping electrode CPE1, and the second electrode E2 may include a second reflection electrode RFE2 and a second capping electrode CPE2.

Each of the first reflection electrode RFE1 and the second reflection electrode RFE2 may include a reflective material. Each of the first reflection electrode RFE1 and the second reflection electrode RFE2 may have a single layered structure or a multilayered structure. For example, each of the first reflection electrode RFE1 and the second reflection electrode RFE2 may have a structure in which indium tin oxide (ITO), silver (Ag), and indium tin oxide (ITO) are sequentially laminated.

The first capping electrode CPE1 may cap the first reflection electrode RFE1, and the second capping electrode CPE2 may cap the second reflection electrode RFE2. For example, each of the first capping electrode CPE1 and the second capping electrode CPE2 may include at least one of indium zinc oxide (IZO), indium tin oxide (ITO), indium gallium oxide (IGO), indium zinc gallium oxide (IGZO), or a mixture/compound thereof.

A light emitting element ED may be disposed on the fifth insulation layer L5. The light emitting element ED may be provided in plurality. The plurality of light emitting elements may be connected in parallel to each other. The light emitting element ED may be electrically connected to the first electrode E1 and the second electrode E2.

The light emitting element ED may be a micro LED element. The micro LED element may be an LED element having a length of several nanometers to several hundred micrometers. However, the length of the micro LED element is merely an example. For example, the length of the micro LED element is not limited to the above-described length range.

Light emitted from the light emitting element ED may be reflected by the first electrode E1 and the second electrode E2 covering the first and second partition walls BR1 and BR2 and then be emitted to the outside of the image display part IDP-1. A pixel area PXA may be defined to correspond to one end of each of the first partition wall BR1 and the second partition wall BR2. The pixel area PXA may correspond to one of the plurality of openings OPAR, OPAG, and OPAB, which are described with reference to FIG. 2.

A sixth insulation layer L6 (or an insulation pattern) may be disposed on the light emitting element ED. The sixth insulation layer L6 may cover at least a portion of a top surface of the light emitting element ED.

The light emitting element ED may be electrically connected to the first electrode E1 through a first connection electrode CNE1 and be electrically connected to the second electrode E2 through a second connection electrode CNE2.

The second connection electrode CNE2 may be disposed on the light emitting element ED and the second electrode E2. A seventh insulation layer L7 may be disposed on the second connection electrode CNE2. The first connection electrode CNE1 may be disposed on the light emitting element ED and the first electrode E1. Even though the light emitting element ED has a length of several hundred micrometers, the second connection electrode CNE2 and the first connection electrode CNE1 may not directly contact each other because the seventh insulation layer L7 may be covered the second connection electrode CNE2. However, this is merely an example. According to another embodiment of the inventive concept, the first connection electrode CNE1 and the second connection electrode CNE2 may be formed at the same time through the same process. In this embodiment, the seventh insulation layer L7 may be omitted.

Each of the first connection electrode CNE1 and the second connection electrode CNE2 may include a conductive material. For example, the conductive material may include at least one of indium zinc oxide (IZO), indium tin oxide (ITO), indium gallium oxide (IGO), indium zinc gallium oxide (IGZO), or a mixture/compound thereof. However, the embodiment of the inventive concept is not limited thereto. For example, the conductive material may be a metal material. The metal material may include, for example, molybdenum, silver, titanium, copper, aluminum, or alloys thereof.

An eighth insulation layer L8 may be disposed on the first connection electrode CNE1 and the seventh insulation layer L7. The eighth insulation layer L8 may be an encapsulation layer. According to another embodiment, the eighth insulation layer L8 may be disposed on a ninth insulation layer L9. The ninth insulation layer L9 may be a planarization layer. The ninth insulation layer L9 may be a surface contacting the flat surface PS of FIG. 2.

Figure 5:
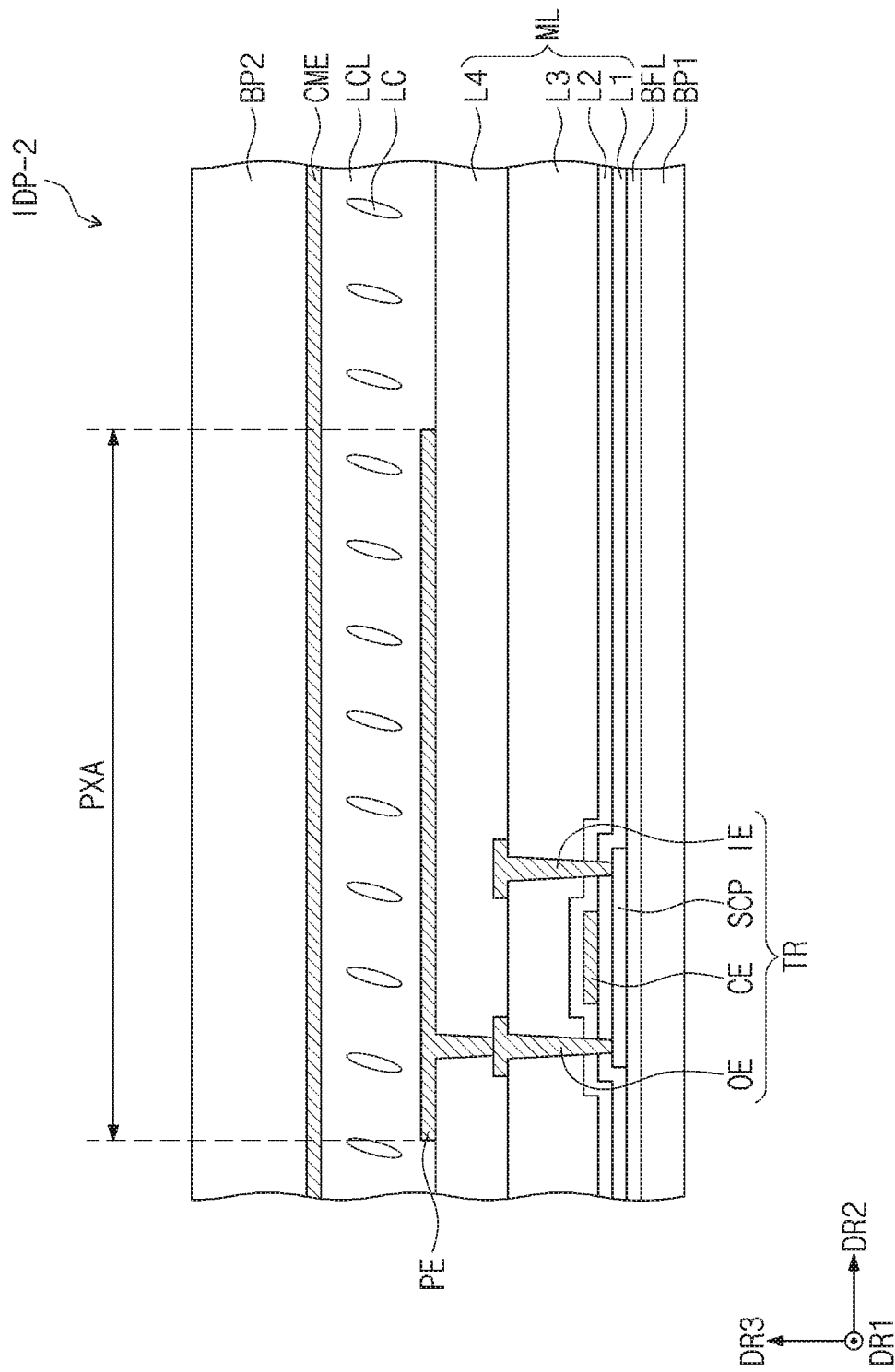
FIG. 5 is a cross-sectional view of an image display part according to an embodiment of the inventive concept.

FIG. 5 is a cross-sectional view of an image display part according to an embodiment of the inventive concept.

Referring to FIG. 5, an image display part IDP-2 may be a liquid crystal display panel. The image display part IDP-2 may include a first base substrate BP1, a second base substrate BP2, a circuit layer ML, a liquid crystal layer LCL, a pixel electrode PE, and a common electrode CME. The same reference numerals are used for the same constituents as those of FIG. 3A, and a description thereof will be omitted.

Each of the first base substrate BP1 and the base substrate BP2 may be a silicon substrate, a plastic substrate, an insulation film, or a laminate structure including a plurality of insulation layers. The second base substrate BP2 may have a top surface contacting the flat surface PS of FIG. 2.

A pixel electrode PE may be disposed on a fourth insulation layer L4. The pixel electrode PE may be electrically connected to an output electrode OE. The liquid crystal layer LCL may be disposed on the pixel electrode PE. The common electrode CME may be disposed on the liquid crystal layer LCL. The common electrode CME may be disposed on one surface of the second base substrate BS2.

An area on which the pixel electrode PE may be defined as a pixel area PXA. The pixel area PXA may correspond to one of the plurality of openings OPAR, OPAG, and OPAB which are described with reference to FIG. 2.

Although the liquid crystal layer LCL is disposed between the common electrode CME and the pixel electrode PE in FIG. 5, the embodiment of the inventive concept is not limited thereto. For example, according to another embodiment of the inventive concept, the liquid crystal layer LCL may be disposed on the common electrode CME and the pixel electrode PE. In this case, the common electrode CME and the pixel electrode PE may be disposed on the first base substrate BS1.

The liquid crystal layer LCL may include a plurality of liquid crystal molecules LC. The liquid crystal molecules LC may be changed in arrangement according to electric fields generated between the common electrode CME and the pixel electrode PE.

Figure 6:
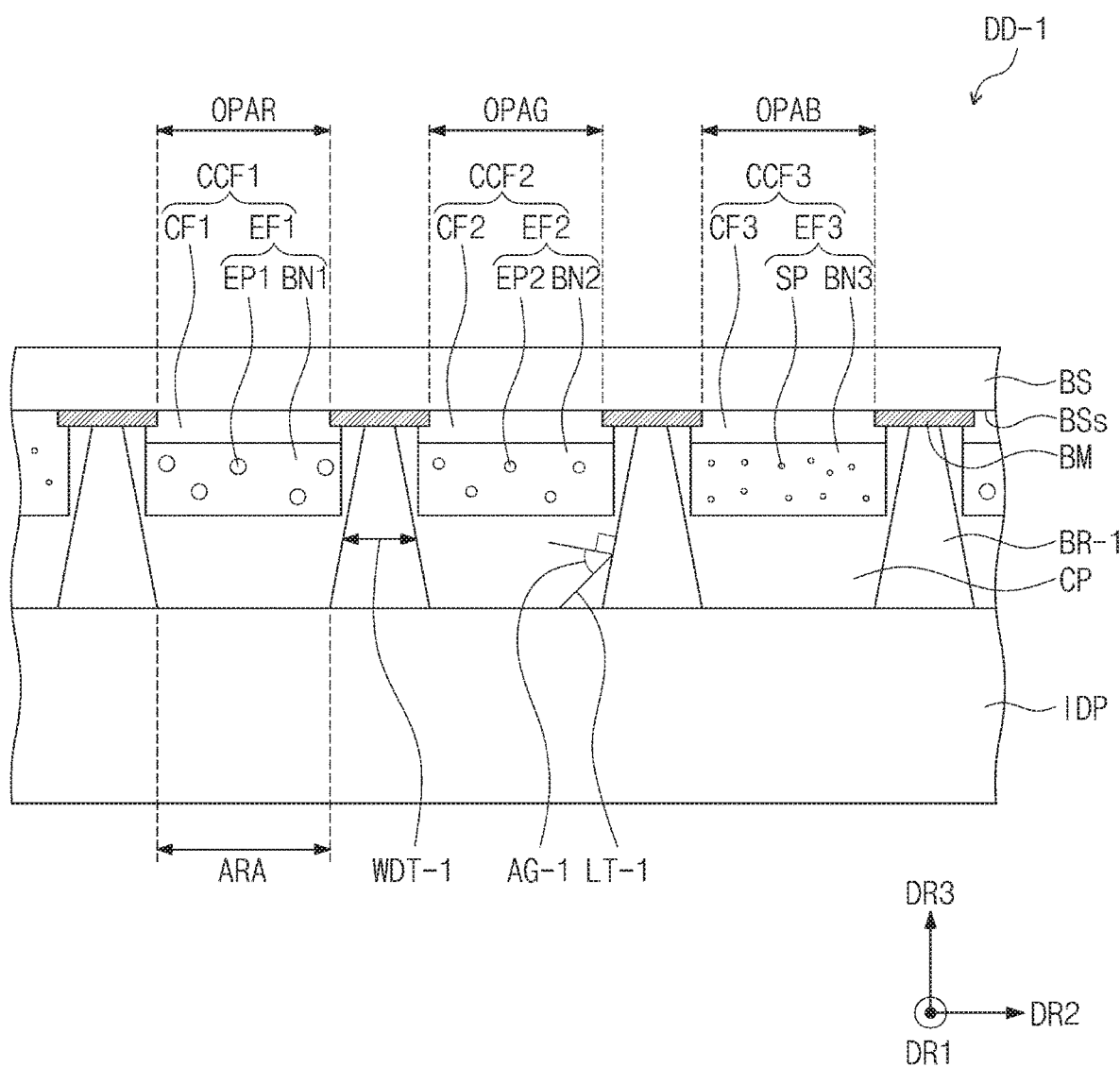
FIG. 6 is a cross-sectional view of a display device according to an embodiment of the inventive concept.

FIG. 6 is a cross-sectional view of a display device according to an embodiment of the inventive concept.

The display device DD-1 of FIG. 6 is different from the display device DD of FIG. 2 in a shape of a partition wall BR-1. For example, the partition wall BR-1 may have a trapezoid shape in a cross-sectional view.

The partition wall BR-1 may have a width WDT-1 that gradually increases from a base layer BS side toward an image display part IDP side. Thus, the partition wall BR-1 may have wider width on the image display part IDP side than that on the base layer BS side. The width WDT-1 of the partition wall BR-1 may represent a width in the second direction DR2.

FIG. 6 illustrates light LT-1 provided from a pixel area. The light LT-1 may be light emitted from the image display part IDP in the same direction as that of the light LT of FIG. 2. Thus, an angle between the light LT and a top surface of the image display part IDP may be the same as that between the light LT-1 and the top surface of the image display part IDP.

The light LT-1 incident onto the partition wall BR-1 may have an incident angle AG-1 greater than that of the light LT of FIG. 2. According to an embodiment of the inventive concept, since the partition wall BR-1 has the trapezoid shape, possibility of total reflection of the light incident into the partition wall BR-1 may increase. Thus, a color mixing phenomenon in which colors are mixed with each other between the adjacent pixels may be more efficiently prevented by the partition wall BR-1. Also, the light totally reflected by a boundary between the cover part CP and the partition wall BR-1 may be incident again onto the corresponding wavelength conversion part, for example, the second wavelength conversion part CCF2 to prevent the light from being lost, thereby improving light efficiency.

Figure 7:
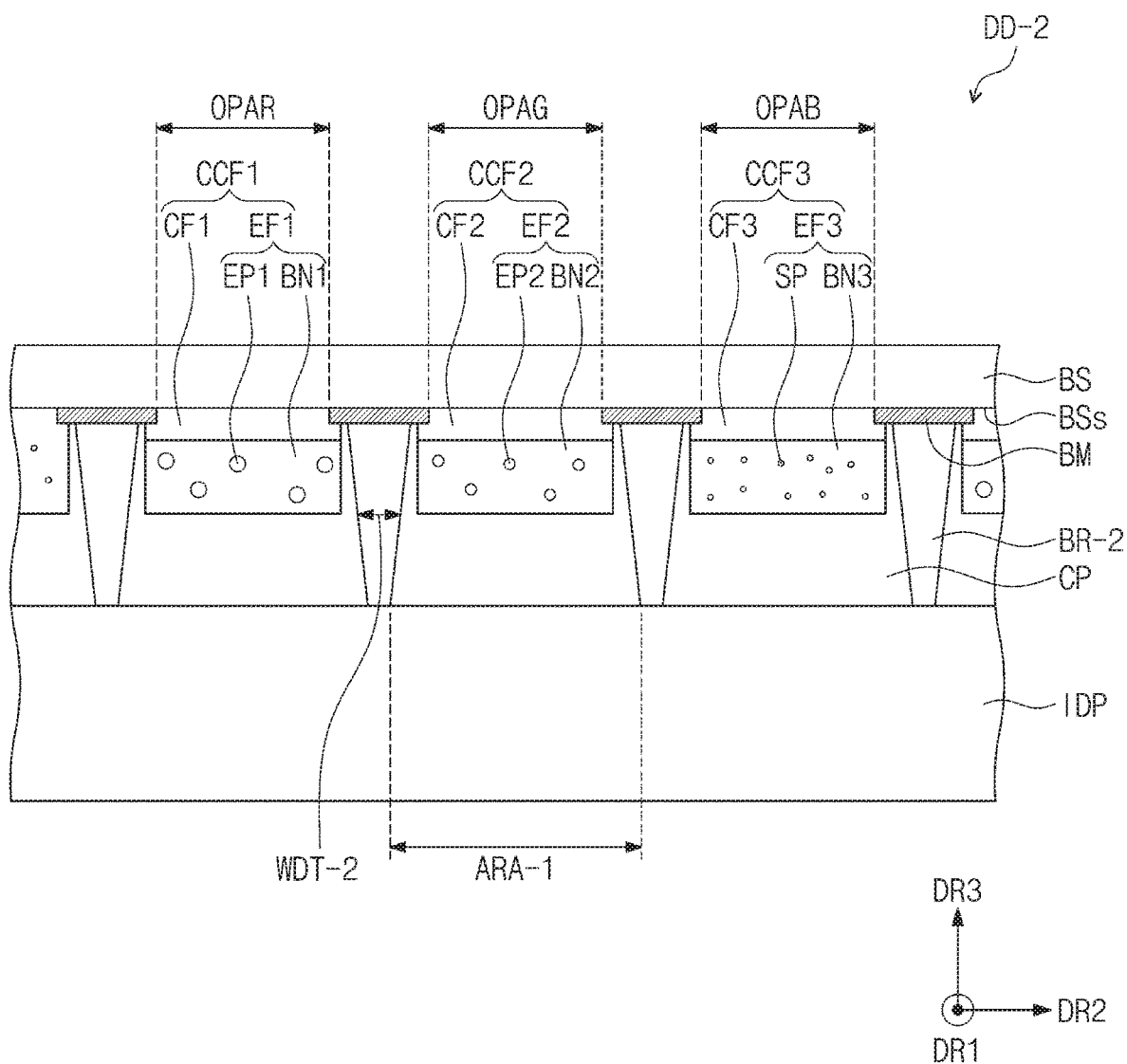
FIG. 7 is a cross-sectional view of a display device according to an embodiment of the inventive concept.

FIG. 7 is a cross-sectional view of a display device according to an embodiment of the inventive concept.

Referring to FIG. 7, a display device DD-2 is different from the display device DD of FIG. 2 in a shape of a partition wall BR-2. For example, the partition wall BR-2 may have an inverted trapezoid shape in a cross-sectional view.

The partition wall BR-2 may have a width WDT-2 that gradually decreases from a base layer BS side toward an image display part IDP side. Thus, the partition wall BR-2 may have a narrow width on the image display part IDP side than that on the base layer BS side.

Figure 8:
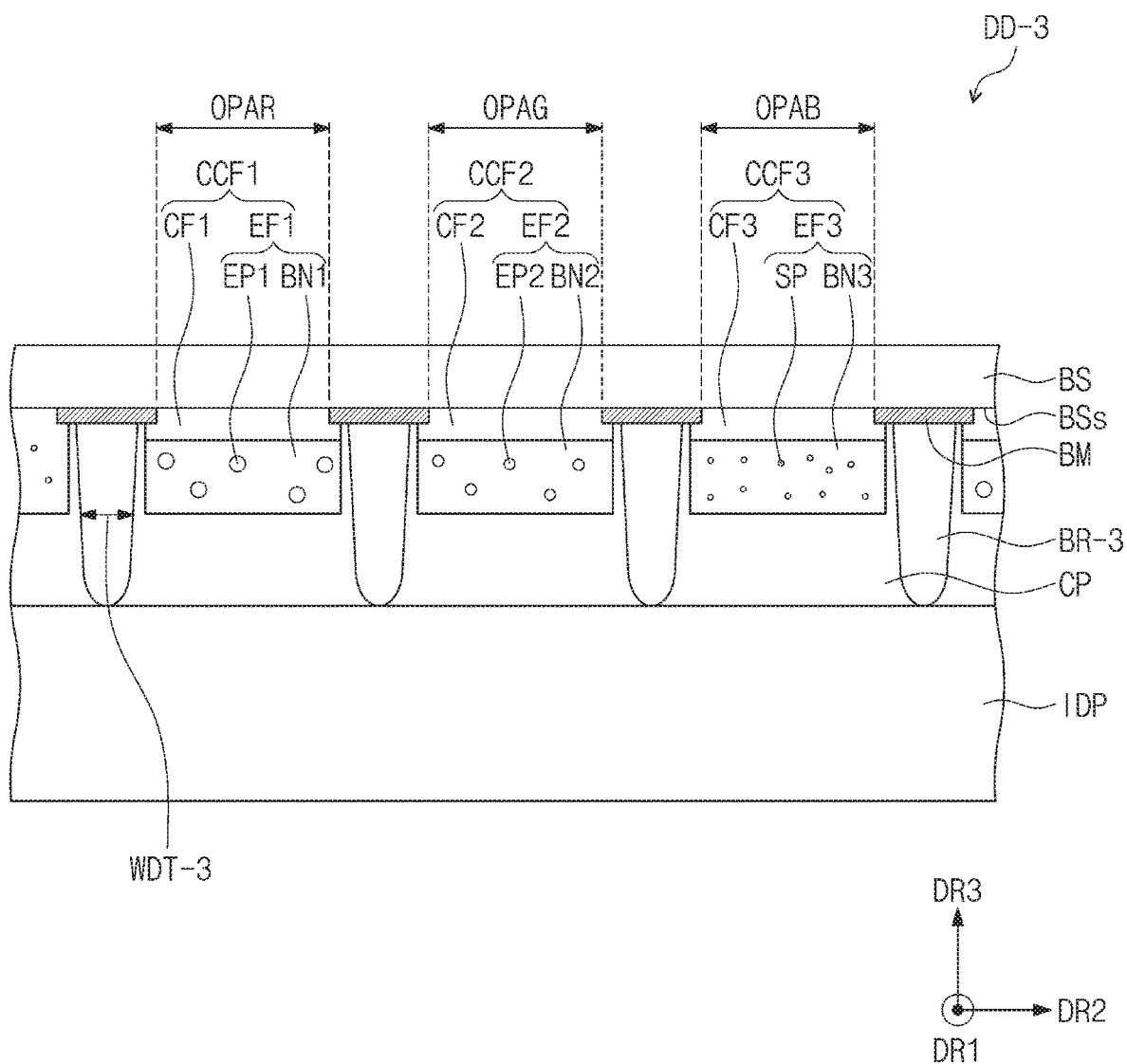
FIG. 8 is a cross-sectional view of a display device according to an embodiment of the inventive concept.

FIG. 8 is a cross-sectional view of a display device according to an embodiment of the inventive concept.

Referring to FIG. 8, a display device DD-3 of FIG. 7 is different from the display device DD of FIG. 2 in a shape of a partition wall BR-3. For example, the partition wall BR-3 may have curvature in a cross-sectional view. The partition wall BR-3 may have a width WDT-3 that gradually decreases from a base layer BS side toward an image display part IDP side.

Figure 9:
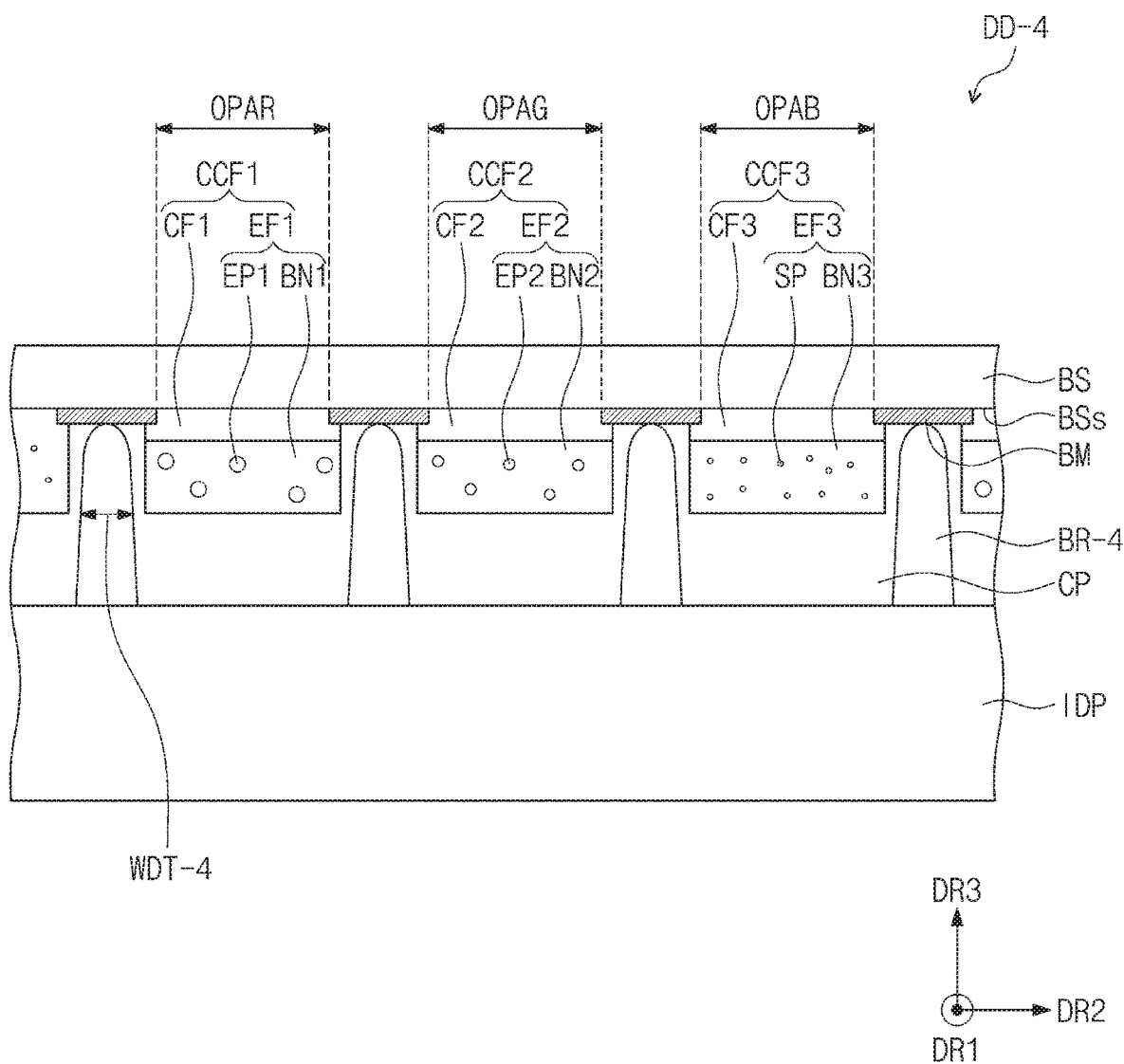
FIG. 9 is a cross-sectional view of a display device according to an embodiment of the inventive concept.

FIG. 9 is a cross-sectional view of a display device according to an embodiment of the inventive concept.

Referring to FIG. 9, a display device DD-4 is different from the display device DD of FIG. 2 in a shape of a partition wall BR-4. For example the partition wall BR-4 may have curvature in a cross-sectional view. The partition wall BR-4 may have a width WDT-4 that gradually increases from a base layer BS side toward an image display part IDP side.

Figure 10:
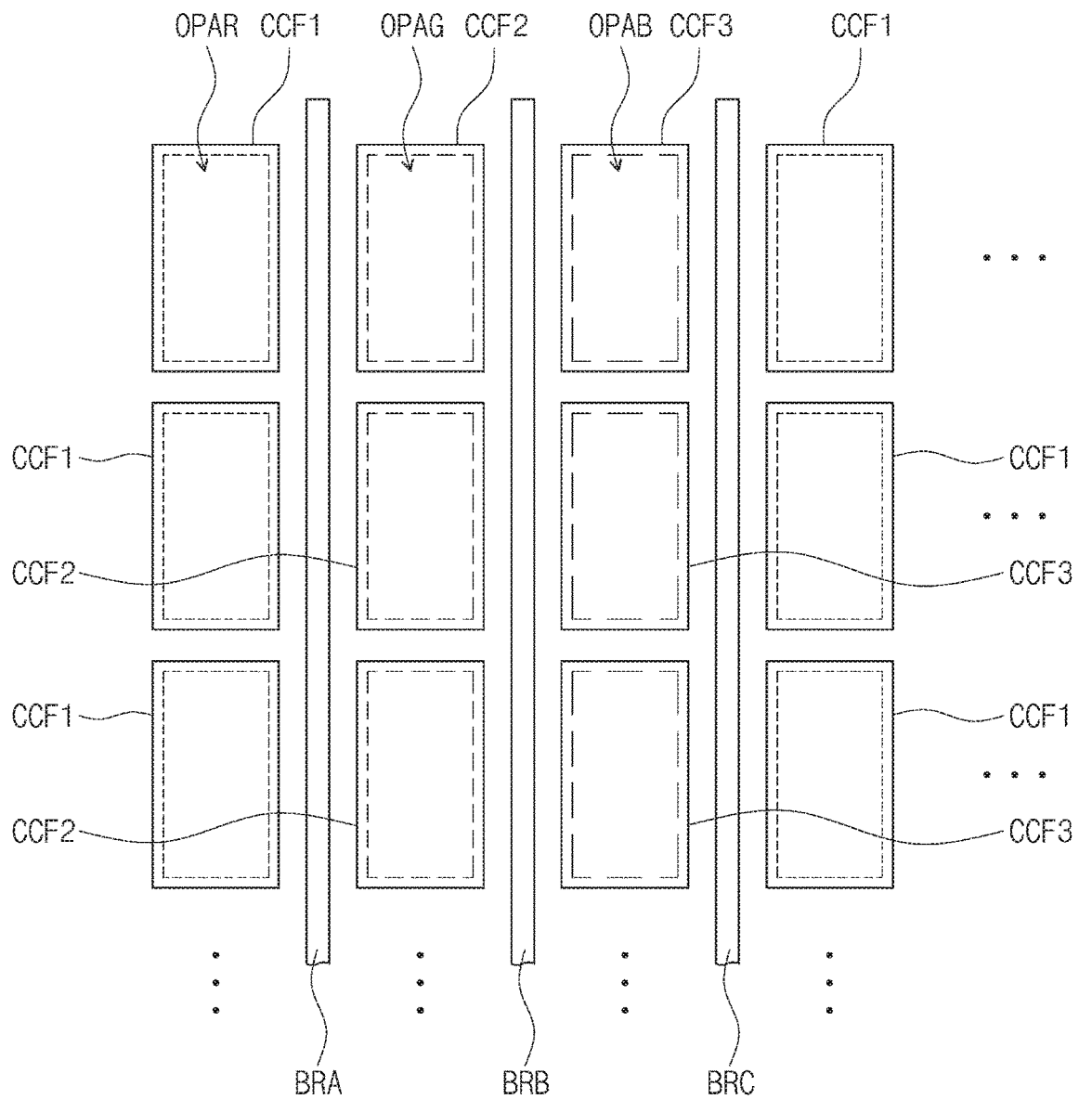
FIG. 10 is a plan view of a display device according to an embodiment of the inventive concept.
Figure 10:
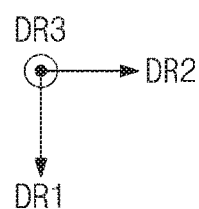

FIG. 10 is a plan view of a display device according to an embodiment of the inventive concept.

Referring to FIG. 10, first to third wavelength conversion parts CCF1, CCF2, and CCF3, first to third openings OPAR, OPAG, and OPAB, and first to third partition walls BRA, BRB, and BRC are illustrated.

Each of the first to third wavelength conversion parts CCF1, CCF2, and CCF3 are provided in plurality. The plurality of first to third wavelength conversion parts CCF1, CCF2, and CCF3 may be arranged along the first direction DR1. For example, the first wavelength conversion parts CCF1 may be arranged in the first direction DR1, the second wavelength conversion parts CCF2 may be arranged in the first direction DR1, and the third wavelength conversion parts CCF3 may be arranged in the first direction DR1. The first to third wavelength conversion parts CCF1, CCF2, and CCF3 may be alternately arranged in the second direction DR2.

Each of the first to third partition walls BRA, BRB, and BRC may have the same cross-section as one of the partition walls BR, BR-1, BR-2, and BR-3, which are described with reference to FIGS. 2, 6, 7, 8, and 9.

The first to third partition walls BRA, BRB, and BRC may extend in the first direction DR1 and be disposed to spaced apart from each other in the second direction DR2. For example, the first partition wall BRA may be disposed between the first wavelength conversion parts CCF1 and the second wavelength conversion parts CCF2, the second partition wall BRB may be disposed between the second wavelength conversion parts CCF2 and the third wavelength conversion parts CCF3, and the third partition wall BRC may be disposed between the third wavelength conversion parts CCF3 and the first wavelength conversion parts CCF1.

Also, according to another embodiment of the inventive concept, the display device may further include additional partition walls (not shown) extending in the second direction DR2. For example, the additional partition walls may be disposed between the first wavelength conversion parts CCF1, between the second wavelength conversion parts CCF2, and between the third wavelength conversion parts CCF3.

Figure 11:
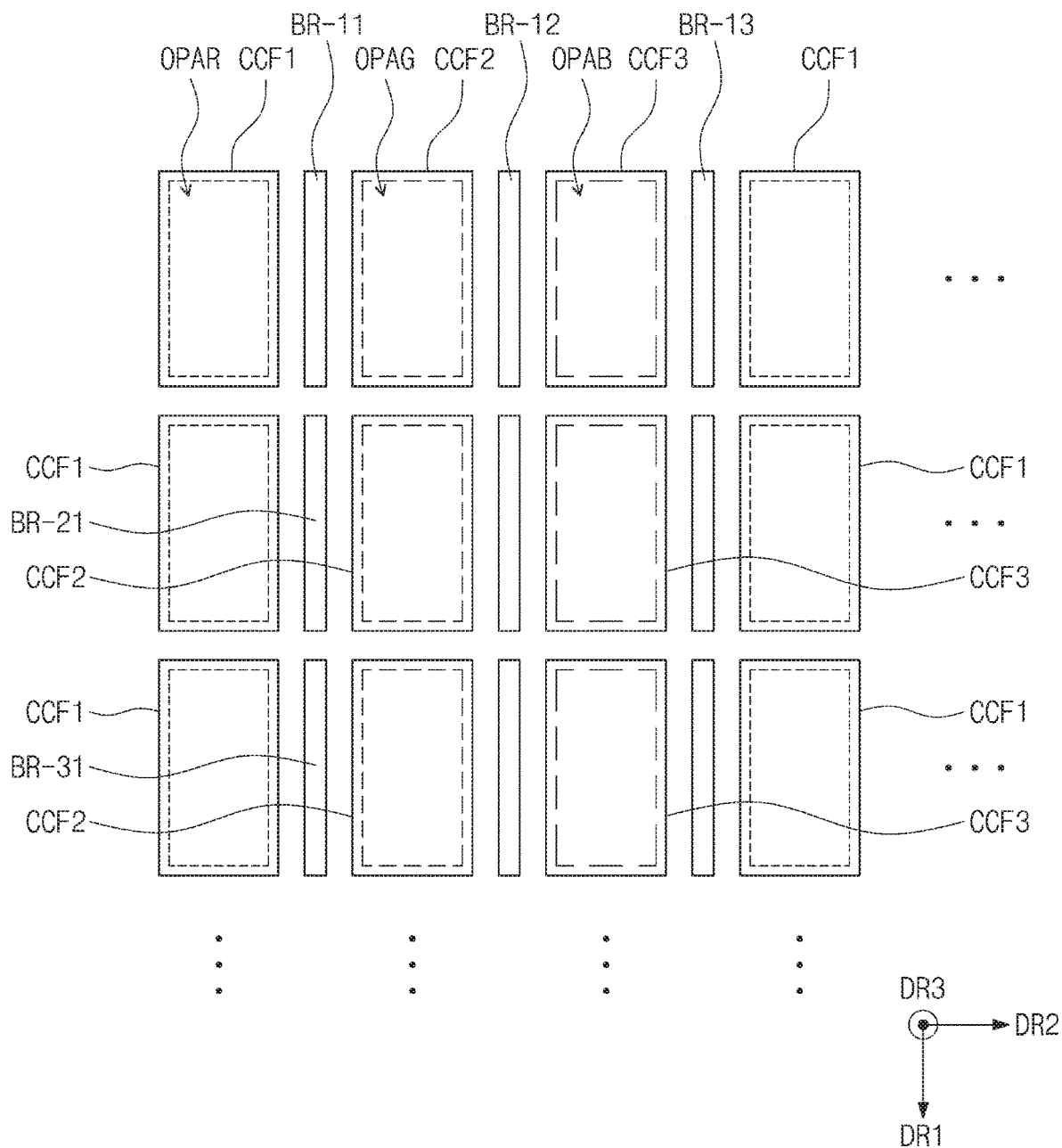
FIG. 11 is a plan view of a display device according to an embodiment of the inventive concept.

FIG. 11 is a plan view of a display device according to an embodiment of the inventive concept.

Referring to FIG. 11, each of partition walls BR-11, BR-12, BR-13, BR-21, and BR-31 may have the same cross-section as one of the partition walls BR, BR-1, BR-2, BR-3, and BR-4, which are described with reference to FIGS. 2, 6, 7, 8, and 9.

The partition walls BR-11, BR-12, BR-13, BR-21, and BR-31 may be arranged in the first and second directions DR1 and DR2. Each of the partition walls BR-11, BR-12, BR-13, BR-21, and BR-31 may extend in the first direction DR1.

A length of the partition walls BR-11, BR-12, BR-13, BR-21, and BR-31 in the first direction may be less than that of each of the first to third partition walls BRA, BRB, and BRC of FIG. 10 in the first direction DR1.

Figure 12:
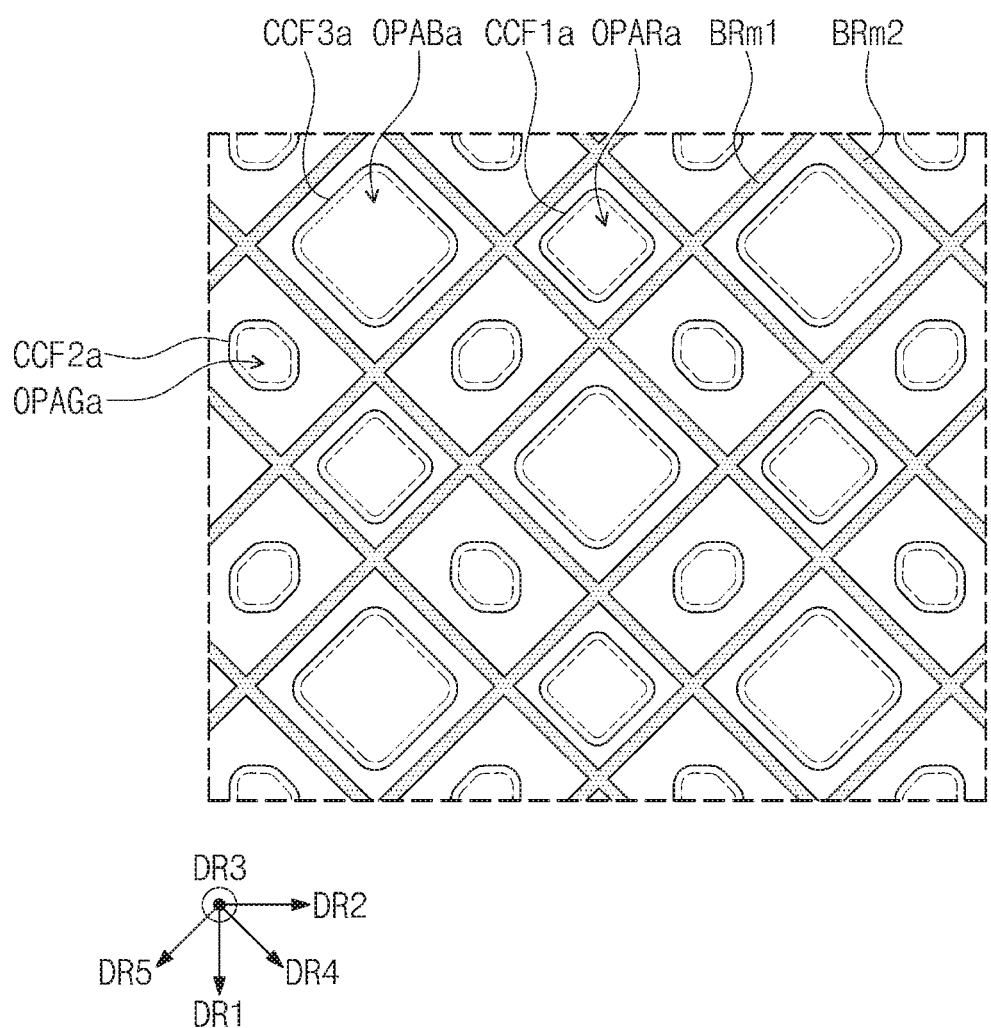
FIG. 12 is a plan view of a display device according to an embodiment of the inventive concept.

FIG. 12 is a plan view of a display device according to an embodiment of the inventive concept.

First to third openings OPARa, OPAGa, and OPABa of FIG. 12 may be arranged in a pantile structure.

First wavelength conversion parts CCF1a overlapping the first openings OPARa and third wavelength conversion parts CCF3a overlapping the third openings OPABa may be alternately arranged in the first direction DR1 and the second direction DR2.

Second wavelength conversion parts CCF2a overlapping the second openings OPAGa may be disposed to be spaced apart from the first wavelength conversion parts CCF1a in a fourth direction DR4 or a fifth direction DR5. The fourth direction DR4 may be defined as a direction between the first direction DR1 and the second direction DR2, and the fifth direction DR5 may be defined as a direction crossing substantially perpendicular to the fourth direction DR4.

The first to third openings OPARa, OPAGa, and OPABa may have areas different from each other. Each of the areas may represent an area when viewed in the plane view. For example, the third openings OPABa providing blue light may have the largest area, and the first openings OPARa providing red light may have the next largest area. The second openings OPAGa providing green light may have the smallest area.

Partition walls BRm1 and BRm2 may not overlap the first to third wavelength conversion parts CCF1a, CCF2a, and CCF3a when viewed in a plane view. For example, the partition walls BRm1 and BRm2 may be disposed to overlap areas adjacent to the area on which the first to third wavelength conversion parts CCF1a, CCF2a, and CCF3a are disposed.

The partition wall BRm1 may extend in the fifth direction DR5 and be disposed to be spaced apart from each other in the fourth direction DR4, and the partition wall BRm2 may extend in the fourth direction DR4 and be disposed to be spaced apart from each other in the fifth direction DR5. Each of the partition walls BRm1 and BRm2 may have the same cross-section as one of the partition walls BR, BR-1, BR-2, and BR-3, which are described with reference to FIGS. 2, 6, 7, 8, and 9.

FIGS. 13A to 13E are views illustrating a method of manufacturing the display device according to an embodiment of the inventive concept.

Figure 13A:
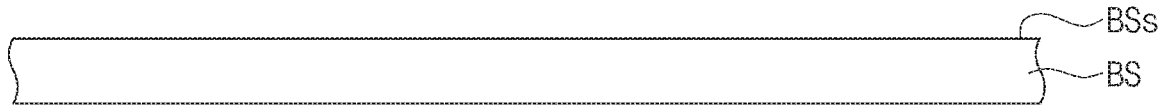
FIGS. 13A, 13B, 13C, 13D and 13E are views illustrating a method of manufacturing the display device according to an embodiment of the inventive concept.

Referring to FIG. 13A, a base layer BS is formed. Although not separately shown, in the manufacturing process, the base layer BS may be disposed on a working substrate (not shown). After a display device is manufacture, the working substrate may be removed from the base layer BS.

Figure 13B:
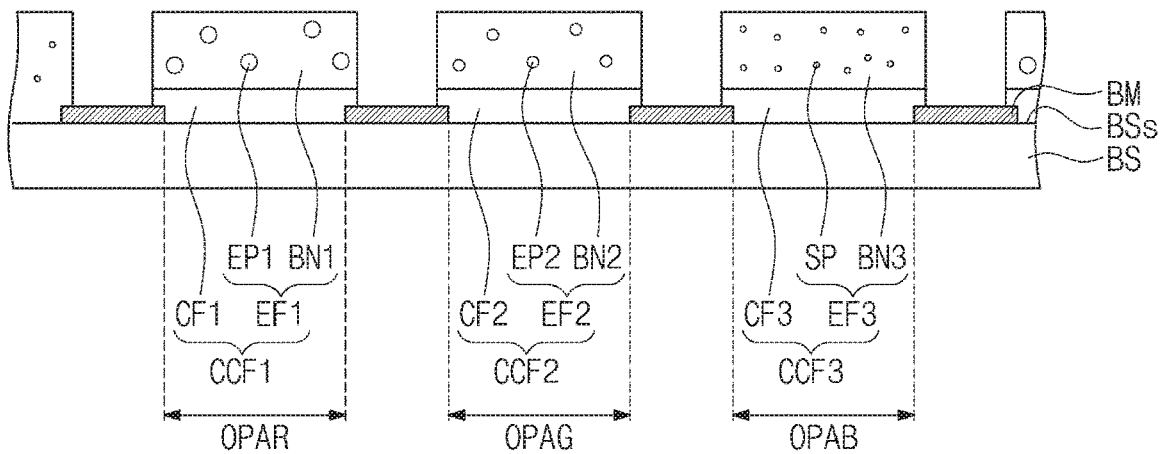

Referring to FIG. 13B, a light blocking layer BM is formed on one surface BSs of the base layer BS. A plurality of first to third openings OPAR, OPAG, and OPAB may be formed in the light blocking layer BM.

First to third wavelength conversion parts CCF1, CCF2, and CCF3 may be formed on the one surface BSs of the base layer BS. The first to third wavelength conversion parts CCF1, CCF2, and CCF3 may one-to-one correspond to the first to third openings OPAR, OPAG, and OPAB to cover the first to third openings OPAR, OPAG, and OPAB. The first to third wavelength conversion parts CCF1, CCF2, and CCF3 may be formed to completely cover the first to third openings OPAR, OPAG, and OPAB and partially cover opposing edges of the light blocking layer BM.

Figure 13C:
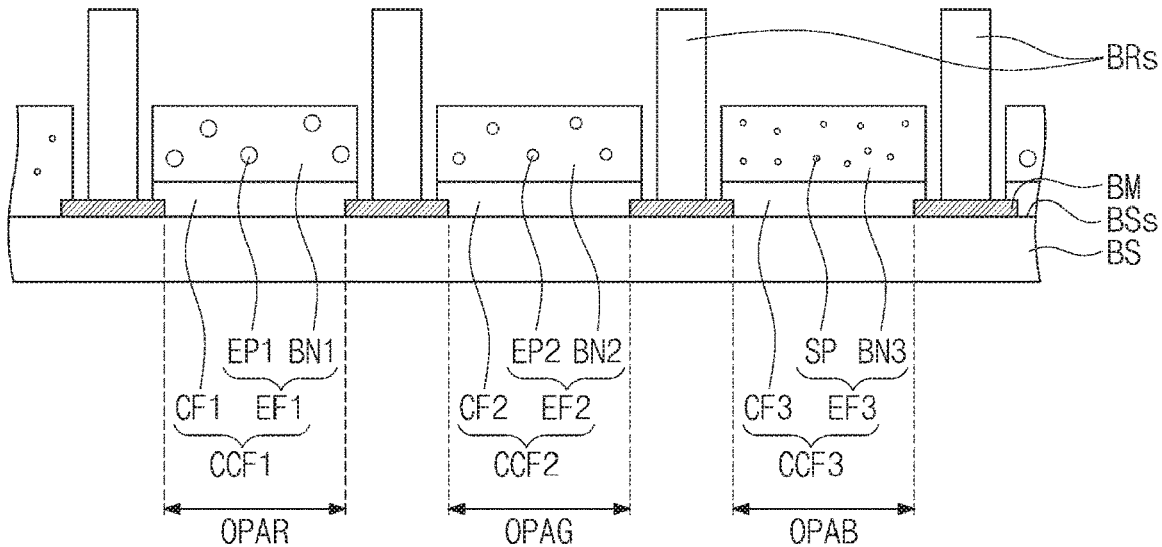

Referring to FIG. 13C, partition walls BRs are formed on the one surface BSs of the base layer BS. The partition walls BRs may be disposed between the first to third wavelength conversion parts CCF1, CCF2, and CCF3. For example, the partition walls BRs may be formed on the light blocking layer BM. In this embodiment, the first to third wavelength conversion parts CCF1, CCF2, and CCF3 may be formed, and then, the partition walls BRs may be formed. Upper surfaces of the partition walls BRs may be higher than upper surfaces of the first to third wavelength conversion parts CCF1, CCF2, and CCF3.

The partition walls BRs may be formed through a photo lithography process or a printing process. In the photo lithography process, for example, the partition walls BRs may include a photosensitive material. After the photosensitive material is applied, an exposure process and a development process may be performed to form the partition walls BRs. The printing process may include, for example, an inkjet printing process, a screen printing process, an imprint printing process, or a dispenser printing process.

Figure 13D:
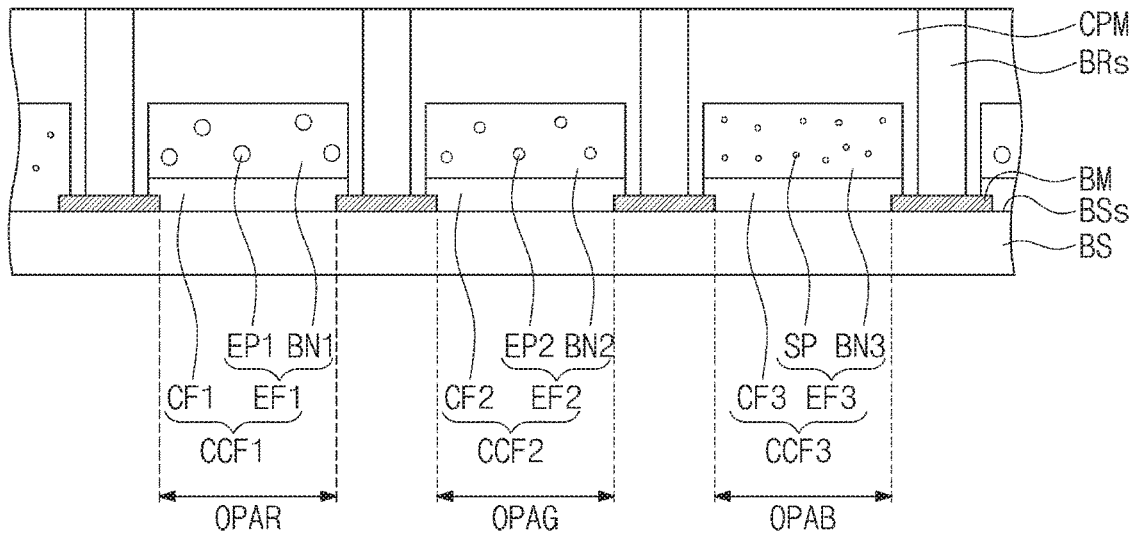

Referring to FIG. 13D, a cover material CPM is provided between the partition walls BRs. Each of the partition walls BRs may serve as a dam. The cover material CPM may be a material having a refractive index greater than that of each of the partition walls BRs.

Figure 13E:
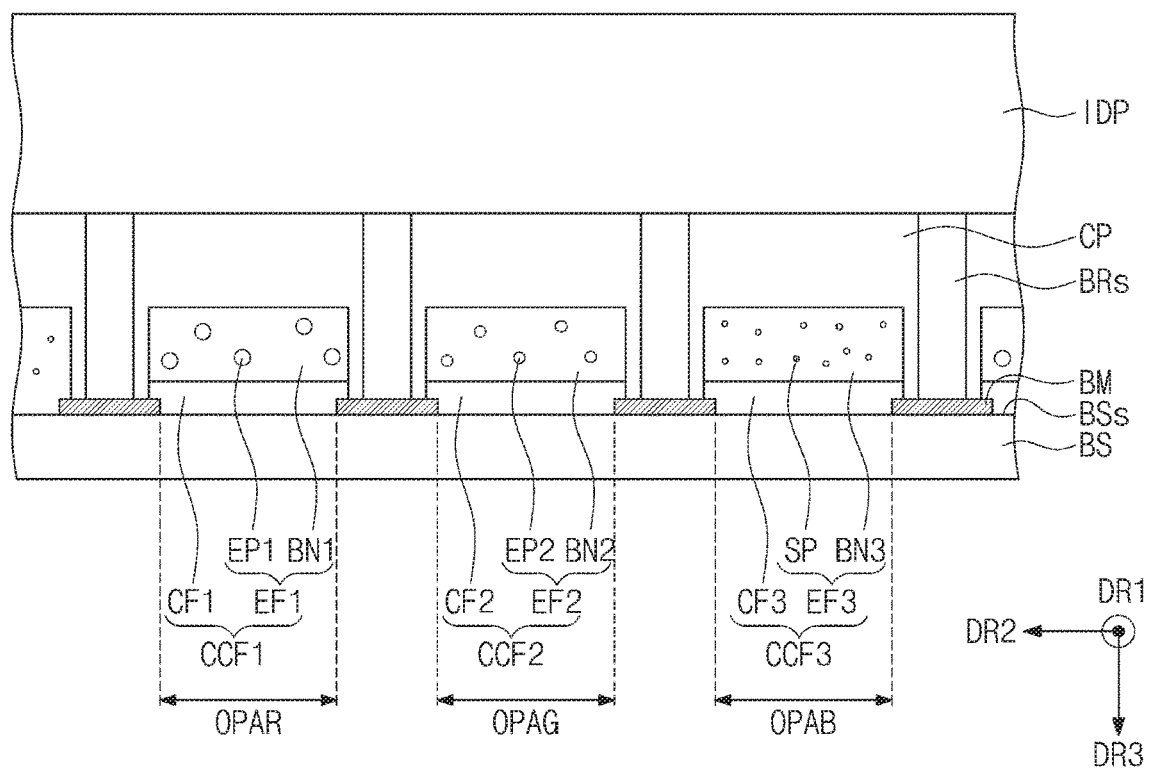

Referring to FIG. 13E, an image display part IDP and the base layer BS on which the wavelength conversion parts CCF1, CCF2, and CCF3 are formed are bonded to each other. After the image display part IDP and the base layer BS are bonded to each other, the cover material CPM may be cured to form a cover part CP. The partition wall BR may be disposed between the image display part IDP and the base layer BS to serve as a spacer. The partition wall BR may uniformly maintain a distance between the image display part IDP and the base layer BS. Thus, a phenomenon in which luminance varies according to a position within the display device DD (see FIG. 1), or a color coordinate is changed may be prevented from occurring.

Figure 14A:
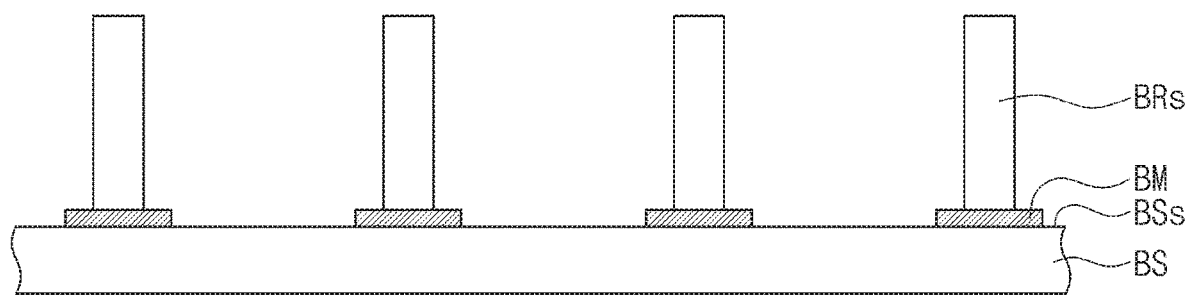
FIGS. 14A and 14B are views illustrating a method of manufacturing the display device according to an embodiment of the inventive concept.
Figure 14B:
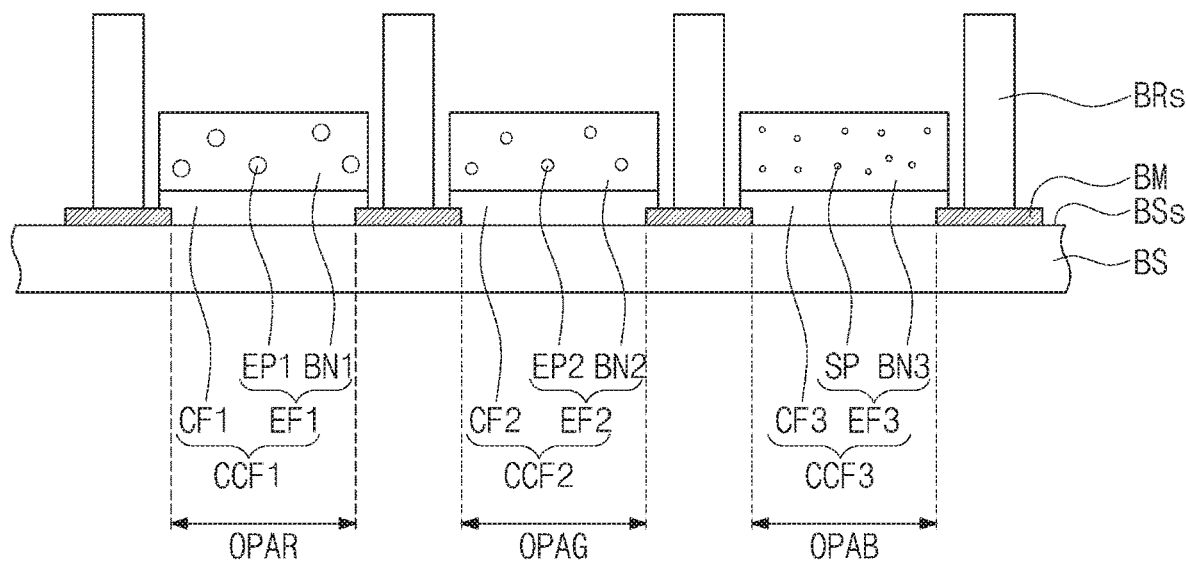

FIGS. 14A and 14B are views illustrating a method of manufacturing the display device according to an embodiment of the inventive concept.

Referring to FIGS. 14A and 14B, partition walls BRs are formed on a light blocking layer BM. After the partition walls BRs are formed, first to third wavelength conversion parts CCF1, CCF2, and CCF3 may be formed between the partition walls BRs. The foregoing method for manufacturing the display device with reference to FIGS. 13A to 13E is different from the method for manufacturing the display device according to this embodiment in a formation order of the partition walls BRs and the first to third wavelength conversion parts CCF1, CCF2, and CCF3.

When the partition walls BRs are formed first, the partition walls BRs may serve to define an area on which the first to third wavelength conversion parts CCF1, CCF2, and CCF3 will be formed. Also, when the partition walls BRs are formed, possibility of damage of the first to third wavelength conversion parts CCF1, CCF2, and CCF3 may be removed.

FIGS. 15A to 15E are views illustrating a method of manufacturing the display device according to an embodiment of the inventive concept.

Figure 15A:
FIGS. 15A, 15B, 15C, 15D and 15E are views illustrating a method of manufacturing the display device according to an embodiment of the inventive concept.
Figure 15B:
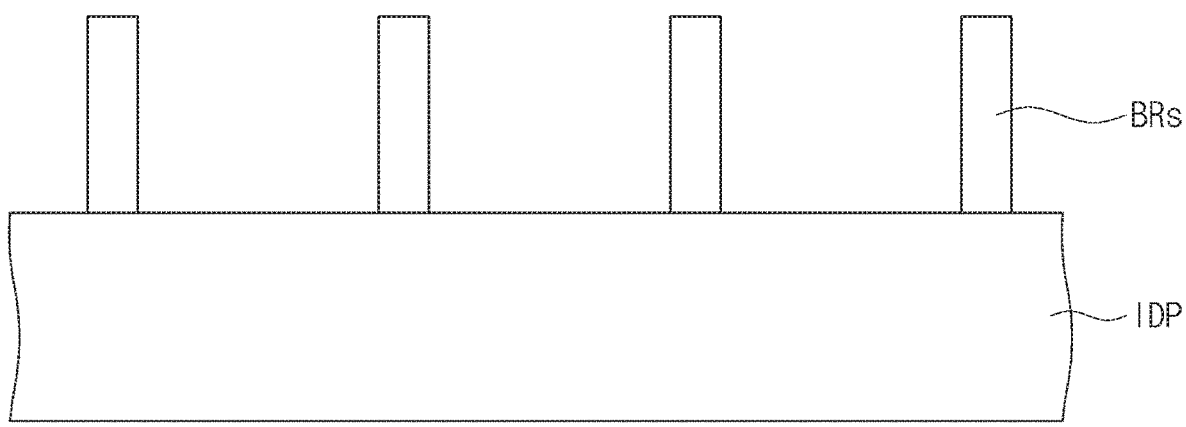

Referring to FIGS. 15A and 15B, an image display part IDP is formed. Partition walls BRs are formed on the image display part IDP. The partition walls BRs may be formed directly on the image display part IDP.

Figure 15C:
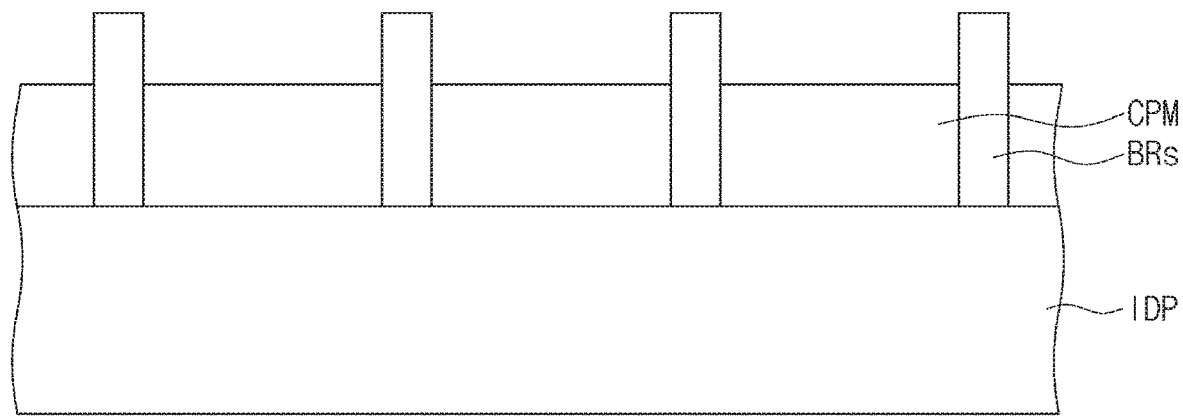

Referring to FIG. 15C, a cover material CPM is provided between the partition walls BRs. The cover material CPM may have flowability. An amount of cover material CPM may be adjusted in consideration of a volume of each of the first to third wavelength conversion parts CCF1, CCF2, and CCF3. For example, the cover material CPM may have a height less than that of each of an upper surface of the partition walls BRs.

Figure 15D:
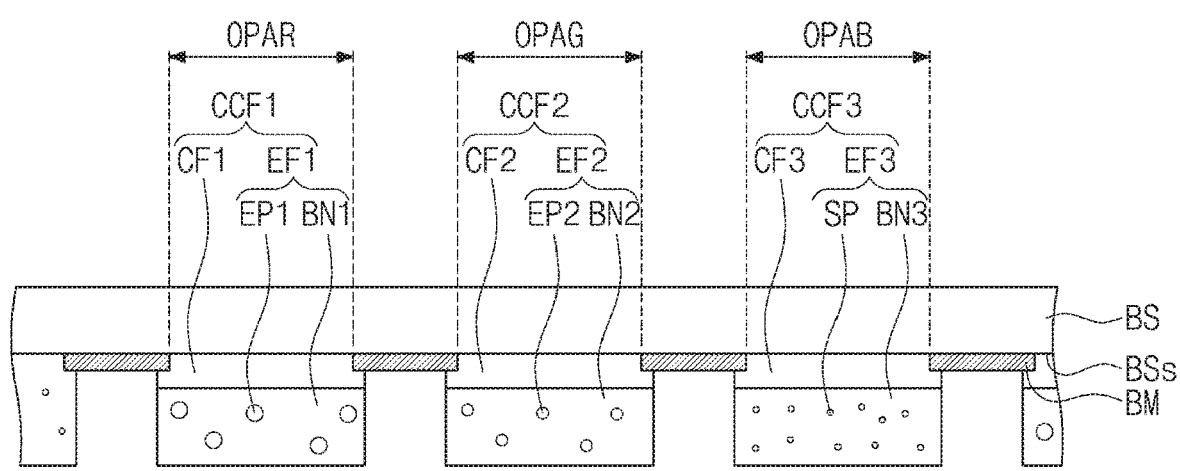
Figure 15D:
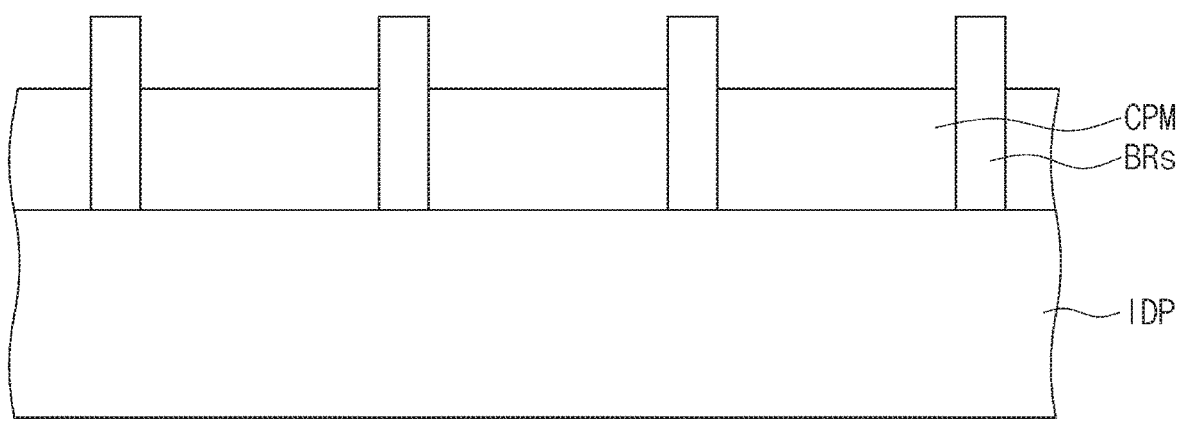

Referring to FIG. 15D, the base layer BS on which a light blocking layer BM and the first to third wavelength conversion parts CCF1, CCF2, and CCF3 are formed is aligned on the image display part IDP on which partition walls BRs and the cover material CPM are disposed. For example, the base layer BS and the image display part IDP may be aligned with each other so that the partition walls BRs overlap areas adjacent to the first to third wavelength conversion parts CCF1, CCF2, and CCF3 on which the light blocking layer BM are disposed.

Figure 15E:
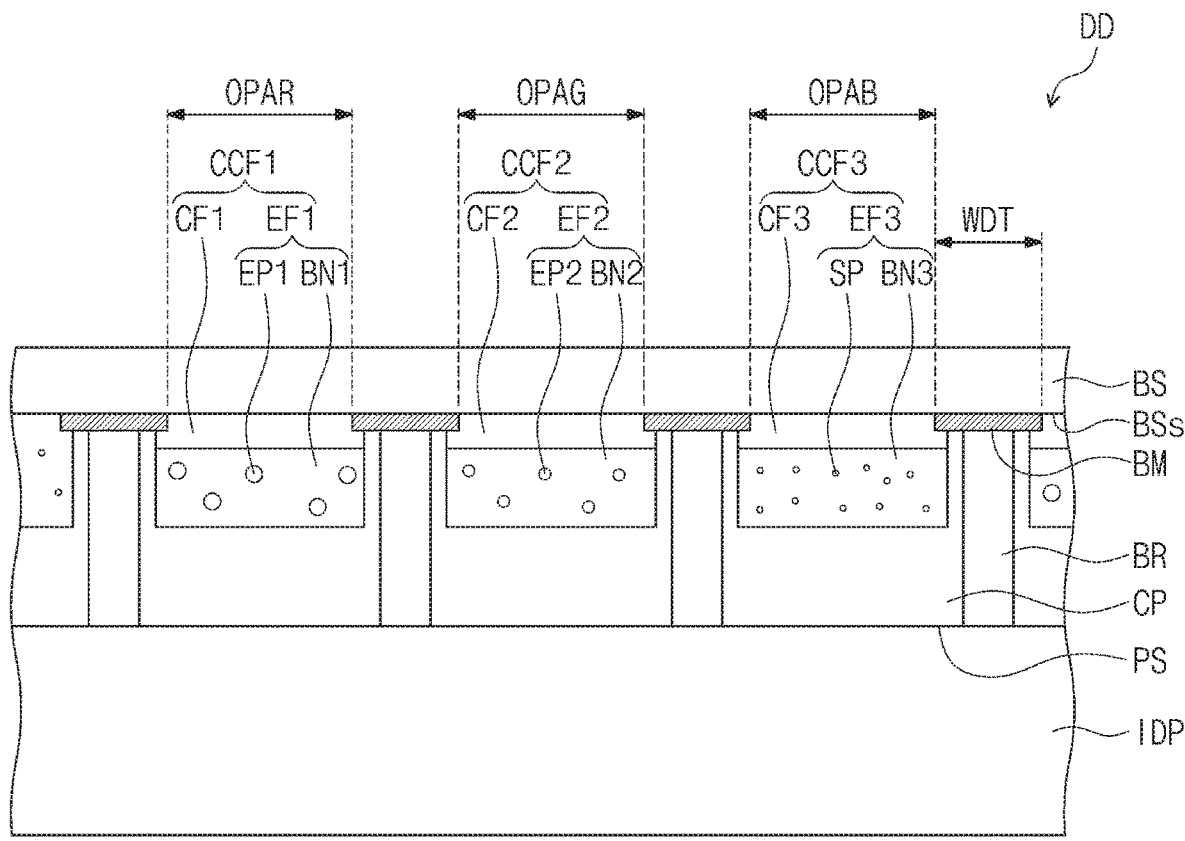
Figure 15E:
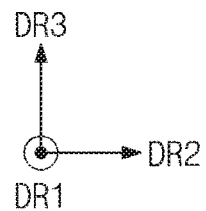

Referring to FIG. 15E, an image display part IDP and the base layer BS are bonded to the partition walls BRs with the cover material CPM is disposed therebetween. After the image display part IDP and the base layer BS are combined with each other, the cover material CPM may be cured to form a cover part CP.

According to the embodiment of the inventive concept, the light, which is emitted to the wavelength conversion part adjacent to the wavelength conversion part corresponding to the pixel area, of the light emitted from the pixel area may be totally reflected by the partition wall and the incident onto the wavelength conversion part corresponding to the pixel area. Thus, the color mixing phenomenon in which the colors are mixed between the adjacent pixels may be prevented by the partition wall to improve the display quality. In addition, since the totally reflected light is incident into the corresponding pixel area and the corresponding wavelength conversion part, the light loss may be prevented to improve the light efficiency. In addition, the partition wall may serve as the spacer. Thus, the distance between the image display part and the base layer on which the wavelength conversion part is disposed may be constantly maintained.

It will be apparent to those skilled in the art that various modifications and variations can be made in the inventive concept. Thus, it is intended that the present disclosure covers the modifications and variations of this inventive concept provided they come within the scope of the appended claims and their equivalents. Hence, the real protective scope of the inventive concept shall be determined by the technical scope of the accompanying claims.

What is claimed is:

1. A display device comprising:
    a base layer;
    a plurality of wavelength conversion parts disposed on one surface of the base layer;
    a partition wall disposed between adjacent wavelength conversion parts of the plurality of wavelength conversion parts and having a first refractive index;
    a cover part configured to cover the plurality of wavelength conversion parts and having a second refractive index greater than the first refractive index; and
    an image display part disposed on a surface provided by the partition wall and the cover part,
    wherein the cover part fills a space between the partition wall and the plurality of wavelength conversion parts.

2. The display device of claim 1, wherein the surface is a flat surface, and the image display part contacts the flat surface provided by the partition wall and the cover part.

3. The display device of claim 1, wherein the image display part comprises:
    a base substrate;
    a circuit layer disposed on the base substrate;
    a light emitting element layer disposed on the circuit layer; and
    an encapsulation layer covering the light emitting element layer and the circuit layer,
    wherein the encapsulation layer directly contacts the partition wall and the cover part.

4. The display device of claim 1, wherein the partition wall has a rectangular shape on a cross-section.

5. The display device of claim 1, wherein the partition wall has a trapezoid shape on a cross-section.

6. The display device of claim 1, wherein the partition wall has a curvature on a cross-section.

7. The display device of claim 1, wherein the partition wall has a width that gradually increases from the base layer side toward the image display part side.

8. The display device of claim 1, wherein the partition wall has a width that gradually decreases from the base layer side toward the image display part side.

9. The display device of claim 1, further comprising a light blocking layer disposed between the base layer and the partition wall.

10. The display device of claim 9, wherein a first sum of a thickness of the light blocking layer and a thickness of the partition wall is substantially the same as a distance between the base layer and the image display part, and the first sum is substantially the same as a second sum of a thickness of one wavelength conversion part of the plurality of wavelength conversion parts and a thickness of the cover part disposed on the wavelength conversion part.

11. The display device of claim 1, wherein the plurality of wavelength conversion parts comprise first wavelength conversion parts and second wavelength conversion parts, and the first wavelength conversion parts are arranged in a first direction, the second wavelength conversion parts are arranged in the first direction, and the first wavelength conversion parts and the second wavelength conversion parts are alternately arranged in a second direction crossing the first direction.

12. The display device of claim 11, wherein the partition wall is provided in plurality, each of the plurality of partition walls extends in the first direction, and the plurality of partition walls are disposed to be spaced apart from each other in the second direction.

13. The display device of claim 11, wherein the partition wall is provided in plurality, and the plurality of partition walls are arranged in the first direction and the second direction.

14. The display device of claim 1, wherein a difference between the first refractive index and the second refractive index is 0.5 or more.

15. The display device of claim 1, wherein the partition wall comprises at least one of poly(tetrafluoroethylene), magnesium fluoride, or polyvinylidene fluoride.

16. A display device comprising:

a base layer;

a light blocking layer which is disposed on the base layer and in which a plurality of openings are defined;

wavelength conversion parts one-to-one corresponding to the plurality of openings to cover the plurality of openings;

a partition wall disposed between the wavelength conversion parts, disposed on the light blocking layer, and having a first refractive index;

a cover part configured to cover the wavelength conversion parts and having a second refractive index greater than the first refractive index; and an image display part disposed on a surface provided by the partition wall and the cover part, wherein a first sum of a thickness of the light blocking layer and a thickness of the partition wall is substantially the same as a distance between the base layer and the image display part, and the first sum is substantially the same as a second sum of a thickness of one wavelength conversion part of the plurality of wavelength conversion parts and a thickness of the cover part disposed on the wavelength conversion part.

* * * * *